United States Patent
Dunklee

(10) Patent No.: US 7,969,173 B2
(45) Date of Patent: *Jun. 28, 2011

(54) CHUCK FOR HOLDING A DEVICE UNDER TEST

(75) Inventor: John Dunklee, Tigard, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 806 days.

This patent is subject to a terminal disclaimer.

(21) Appl. No.: 11/977,134

(22) Filed: Oct. 23, 2007

(65) Prior Publication Data

US 2010/0109695 A1 May 6, 2010

Related U.S. Application Data

(60) Division of application No. 11/204,910, filed on Aug. 15, 2005, now Pat. No. 7,352,168, which is a continuation of application No. 09/877,823, filed on Jun. 7, 2001, now Pat. No. 6,965,226.

(60) Provisional application No. 60/230,212, filed on Sep. 5, 2000.

(51) Int. Cl.
*G01R 31/00* (2006.01)

(52) U.S. Cl. .............. 324/756.07; 324/756.01
(58) Field of Classification Search .......... None
See application file for complete search history.

(56) References Cited

U.S. PATENT DOCUMENTS

| | | | |
|---|---|---|---|
| 1,191,486 A | 7/1916 | Tyler | |
| 1,337,866 A | 4/1920 | Whitacker | |
| 2,106,003 A | 1/1938 | Hewitt | |
| 2,142,625 A | 1/1939 | Zoethout | |
| 2,197,081 A | 4/1940 | Piron | |
| 2,264,685 A | 12/1941 | Wells et al. | |
| 2,376,101 A | 5/1945 | Tyzzer | |
| 2,389,668 A | 11/1945 | Johnson | |
| 2,471,897 A | 5/1949 | Rappi | |
| 2,812,502 A | 11/1957 | Doherty | |
| 3,176,091 A | 3/1965 | Hanson et al. | |
| 3,185,927 A | 5/1965 | Margulis et al. | |
| 3,192,844 A | 7/1965 | Szasz et al. | |
| 3,193,712 A | 7/1965 | Harris | |
| 3,201,721 A | 8/1965 | Voelcker | |
| 3,230,299 A | 1/1966 | Radziekowski | |
| 3,256,484 A | 6/1966 | Terry | |
| 3,265,969 A | 8/1966 | Catu | |
| 3,289,046 A | 11/1966 | Carr | |
| 3,333,274 A | 7/1967 | Forcier | |
| 3,359,014 A | 12/1967 | Clements | |
| 3,405,361 A | 10/1968 | Kattner et al. | |
| 3,408,565 A | 10/1968 | Frick et al. | |
| 3,435,185 A | 3/1969 | Gerard | |

(Continued)

FOREIGN PATENT DOCUMENTS

CN 1083975 3/1994

(Continued)

OTHER PUBLICATIONS

Mark S. Boguski and Martin W. Mcintosh, "Biomedical informatics for proteomics," insight: review article, Nature 422, 233-237 (2003); doi:10.1038/nature01515, Mar. 13, 2003.

(Continued)

*Primary Examiner* — Paresh Patel

(74) *Attorney, Agent, or Firm* — Chernoff, Vilhauer, McClung & Stenzel

(57) ABSTRACT

A chuck for a probe station.

8 Claims, 12 Drawing Sheets

U.S. PATENT DOCUMENTS

| | | |
|---|---|---|
| 3,484,679 A | 12/1969 | Hodgson et al. |
| 3,596,228 A | 7/1971 | Reed, Jr. et al. |
| 3,602,845 A | 8/1971 | Agrios et al. |
| 3,609,539 A | 9/1971 | Gunthert |
| 3,642,415 A | 2/1972 | Johnson |
| 3,648,169 A | 3/1972 | Wiesler |
| 3,654,873 A | 4/1972 | Graham |
| 3,662,318 A | 5/1972 | Decuyper |
| 3,666,296 A | 5/1972 | Fischetti |
| 3,700,998 A | 10/1972 | Lee et al. |
| 3,710,251 A | 1/1973 | Hagge et al. |
| 3,714,572 A | 1/1973 | Ham et al. |
| 3,740,900 A | 6/1973 | Youmans et al. |
| 3,775,644 A | 11/1973 | Cotner et al. |
| 3,777,260 A | 12/1973 | Davies et al. |
| 3,810,017 A | 5/1974 | Wiesler et al. |
| 3,814,838 A | 6/1974 | Shafer |
| 3,814,888 A | 6/1974 | Bowers et al. |
| 3,829,076 A | 8/1974 | Sofy |
| 3,836,751 A | 9/1974 | Anderson |
| 3,858,212 A | 12/1974 | Tompkins et al. |
| 3,863,181 A | 1/1975 | Glance et al. |
| 3,866,093 A | 2/1975 | Kusters et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,976,959 A | 8/1976 | Gaspari |
| 3,992,073 A | 11/1976 | Buchoff et al. |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,035,723 A | 7/1977 | Kvaternik |
| 4,038,894 A | 8/1977 | Knibbe et al. |
| 4,042,119 A | 8/1977 | Hassan et al. |
| 4,049,252 A | 9/1977 | Bell |
| 4,066,943 A | 1/1978 | Roch |
| 4,072,576 A | 2/1978 | Arwin et al. |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,135,131 A | 1/1979 | Larsen et al. |
| 4,151,465 A | 4/1979 | Lenz |
| 4,161,692 A | 7/1979 | Tarzwell |
| 4,172,993 A | 10/1979 | Leach |
| 4,186,338 A | 1/1980 | Fichtenbaum |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Tshirch et al. |
| 4,287,473 A | 9/1981 | Sawyer |
| 4,327,180 A | 4/1982 | Chen |
| 4,330,783 A | 5/1982 | Toia |
| 4,342,958 A | 8/1982 | Russell |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,376,920 A | 3/1983 | Smith |
| 4,383,178 A | 5/1983 | Shibata et al. |
| 4,383,217 A | 5/1983 | Shiell |
| 4,401,945 A | 8/1983 | Juengel |
| 4,414,638 A | 11/1983 | Talambrias |
| 4,419,626 A | 12/1983 | Cedrone et al. |
| 4,425,395 A | 1/1984 | Negishi et al. |
| 4,426,619 A | 1/1984 | Demand |
| 4,431,967 A | 2/1984 | Nishioka |
| 4,453,142 A | 6/1984 | Murphy |
| 4,468,629 A | 8/1984 | Choma, Jr. |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,515,133 A | 5/1985 | Roman |
| 4,515,439 A | 5/1985 | Esswein |
| 4,528,504 A | 7/1985 | Thornton, Jr. et al. |
| 4,531,474 A | 7/1985 | Inuta |
| 4,532,423 A | 7/1985 | Tojo et al. |
| 4,552,033 A | 11/1985 | Marzhauser |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,588,950 A | 5/1986 | Henley |
| 4,588,970 A | 5/1986 | Donecker et al. |
| 4,621,169 A | 11/1986 | Petinelli et al. |
| 4,626,618 A | 12/1986 | Takaoka et al. |
| 4,641,659 A | 2/1987 | Sepponen |
| 4,642,417 A | 2/1987 | Ruthrof et al. |
| 4,646,005 A | 2/1987 | Ryan |
| 4,651,115 A | 3/1987 | Wu |
| 4,665,360 A | 5/1987 | Phillips |
| 4,673,839 A | 6/1987 | Veenendaal |
| 4,675,600 A | 6/1987 | Gergin |
| 4,680,538 A | 7/1987 | Dalman et al. |
| 4,684,783 A | 8/1987 | Gore |
| 4,684,883 A | 8/1987 | Ackerman et al. |
| 4,691,163 A | 9/1987 | Blass et al. |
| 4,691,831 A | 9/1987 | Suzuki et al. |
| 4,694,245 A | 9/1987 | Frommes |
| 4,695,794 A | 9/1987 | Bargett et al. |
| 4,697,143 A | 9/1987 | Lockwood et al. |
| 4,703,433 A | 10/1987 | Sharrit |
| 4,705,447 A | 11/1987 | Smith |
| 4,709,141 A | 11/1987 | Olsen |
| 4,711,563 A | 12/1987 | Lass |
| 4,712,370 A | 12/1987 | MacGee |
| 4,713,347 A | 12/1987 | Mitchell et al. |
| 4,725,793 A | 2/1988 | Igarashi |
| 4,727,637 A | 3/1988 | Buckwitz et al. |
| 4,730,158 A | 3/1988 | Kasai et al. |
| 4,731,577 A | 3/1988 | Logan |
| 4,734,872 A | 3/1988 | Eager et al. |
| 4,739,259 A | 4/1988 | Hadwin et al. |
| 4,742,571 A | 5/1988 | Letron |
| 4,744,041 A | 5/1988 | Strunk et al. |
| 4,746,857 A | 5/1988 | Sakai et al. |
| 4,754,239 A | 6/1988 | Sedivec |
| 4,755,746 A | 7/1988 | Mallory et al. |
| 4,755,747 A | 7/1988 | Sato |
| 4,755,874 A | 7/1988 | Esrig et al. |
| 4,757,255 A | 7/1988 | Margozzi |
| 4,758,785 A | 7/1988 | Rath |
| 4,759,712 A | 7/1988 | Demand |
| 4,766,384 A | 8/1988 | Kleinberg et al. |
| 4,771,234 A | 9/1988 | Cook et al. |
| 4,772,846 A | 9/1988 | Reeds |
| 4,777,434 A | 10/1988 | Miller et al. |
| 4,780,670 A | 10/1988 | Cherry |
| 4,783,625 A | 11/1988 | Harry et al. |
| 4,784,213 A | 11/1988 | Eager et al. |
| 4,786,867 A | 11/1988 | Yamatsu |
| 4,787,752 A | 11/1988 | Fraser et al. |
| 4,791,363 A | 12/1988 | Logan |
| 4,795,962 A | 1/1989 | Yanagawa et al. |
| 4,805,627 A | 2/1989 | Klingenbeck et al. |
| 4,810,981 A | 3/1989 | Herstein |
| 4,812,754 A | 3/1989 | Tracy et al. |
| 4,816,767 A | 3/1989 | Cannon et al. |
| 4,818,169 A | 4/1989 | Schram et al. |
| 4,827,211 A | 5/1989 | Strid et al. |
| 4,831,494 A | 5/1989 | Arnold et al. |
| 4,838,802 A | 6/1989 | Soar |
| 4,839,587 A | 6/1989 | Flatley et al. |
| 4,845,426 A | 7/1989 | Nolan et al. |
| 4,849,689 A | 7/1989 | Gleason et al. |

| | | | | | |
|---|---|---|---|---|---|
| 4,853,613 A | 8/1989 | Sequeira et al. | 5,172,051 A | 12/1992 | Zamborelli |
| 4,853,624 A | 8/1989 | Rabjohn | 5,187,443 A | 2/1993 | Bereskin |
| 4,853,627 A | 8/1989 | Gleason et al. | 5,198,752 A | 3/1993 | Miyata et al. |
| 4,856,426 A | 8/1989 | Wirz | 5,198,753 A | 3/1993 | Hamburgen |
| 4,856,904 A | 8/1989 | Akagawa | 5,198,756 A | 3/1993 | Jenkins et al. |
| 4,858,160 A | 8/1989 | Strid et al. | 5,198,758 A | 3/1993 | Iknaian et al. |
| 4,859,989 A | 8/1989 | McPherson | 5,202,558 A | 4/1993 | Barker |
| 4,864,227 A | 9/1989 | Sato | 5,209,088 A | 5/1993 | Vaks |
| 4,871,883 A | 10/1989 | Guiol | 5,210,377 A | 5/1993 | Kennedy et al. |
| 4,871,965 A | 10/1989 | Elbert et al. | 5,210,485 A | 5/1993 | Kreiger et al. |
| 4,884,026 A | 11/1989 | Hayakawa et al. | 5,214,243 A | 5/1993 | Johnson |
| 4,884,206 A | 11/1989 | Mate | 5,214,374 A | 5/1993 | St. Onge |
| 4,888,550 A | 12/1989 | Reid | 5,218,185 A | 6/1993 | Gross |
| 4,891,584 A | 1/1990 | Kamieniecki et al. | 5,220,277 A | 6/1993 | Reitinger |
| 4,893,914 A | 1/1990 | Hancock et al. | 5,221,905 A | 6/1993 | Bhangu et al. |
| 4,894,612 A | 1/1990 | Drake et al. | 5,225,037 A | 7/1993 | Elder et al. |
| 4,896,109 A | 1/1990 | Rauscher | 5,225,796 A | 7/1993 | Williams et al. |
| 4,899,998 A | 2/1990 | Teramachi | 5,227,730 A | 7/1993 | King et al. |
| 4,904,933 A | 2/1990 | Snyder et al. | 5,232,789 A | 8/1993 | Platz et al. |
| 4,904,935 A | 2/1990 | Calma et al. | 5,233,197 A | 8/1993 | Bowman et al. |
| 4,906,920 A | 3/1990 | Huff et al. | 5,233,291 A | 8/1993 | Kouno et al. |
| 4,916,398 A | 4/1990 | Rath | 5,233,306 A | 8/1993 | Misra |
| 4,918,279 A | 4/1990 | Babel et al. | 5,237,267 A | 8/1993 | Harwood et al. |
| 4,918,374 A | 4/1990 | Stewart et al. | 5,245,292 A | 9/1993 | Milesky et al. |
| 4,918,383 A | 4/1990 | Huff et al. | 5,264,788 A | 11/1993 | Smith |
| 4,922,128 A | 5/1990 | Dhong et al. | 5,266,889 A | 11/1993 | Harwood et al. |
| 4,922,186 A | 5/1990 | Tsuchiya et al. | 5,267,088 A | 11/1993 | Nomura |
| 4,923,407 A | 5/1990 | Rice et al. | 5,270,664 A | 12/1993 | McMurtry et al. |
| 4,926,118 A | 5/1990 | O'Connor et al. | 5,274,336 A | 12/1993 | Crook et al. |
| 4,929,893 A | 5/1990 | Sato et al. | 5,278,494 A | 1/1994 | Obigane |
| 4,933,634 A | 6/1990 | Cuzin et al. | 5,280,156 A | 1/1994 | Niori et al. |
| 4,961,050 A | 10/1990 | Harwood et al. | 5,298,972 A | 3/1994 | Heffner |
| 4,968,931 A | 11/1990 | Littlebury et al. | 5,303,938 A | 4/1994 | Miller et al. |
| 4,978,907 A | 12/1990 | Smith | 5,304,924 A | 4/1994 | Yamano et al. |
| 4,978,914 A | 12/1990 | Akimoto et al. | 5,315,237 A | 5/1994 | Iwakura et al. |
| 4,982,153 A | 1/1991 | Collins et al. | 5,321,352 A | 6/1994 | Takebuchi |
| 4,994,737 A | 2/1991 | Carlton et al. | 5,321,453 A | 6/1994 | Mori et al. |
| 5,001,423 A | 3/1991 | Abrami et al. | 5,325,052 A | 6/1994 | Yamashita |
| 5,006,796 A | 4/1991 | Burton et al. | 5,334,931 A | 8/1994 | Clarke et al. |
| 5,010,296 A | 4/1991 | Okada et al. | 5,336,989 A | 8/1994 | Hofer |
| 5,019,692 A | 5/1991 | Nbedi et al. | 5,345,170 A | 9/1994 | Schwindt et al. |
| 5,030,907 A | 7/1991 | Yih et al. | 5,357,211 A | 10/1994 | Bryson et al. |
| 5,034,688 A | 7/1991 | Moulene et al. | 5,363,050 A | 11/1994 | Guo et al. |
| 5,041,782 A | 8/1991 | Marzan | 5,369,368 A | 11/1994 | Kassen et al. |
| 5,045,781 A | 9/1991 | Gleason et al. | 5,369,370 A | 11/1994 | Stratmann et al. |
| 5,047,725 A | 9/1991 | Strid et al. | 5,371,457 A | 12/1994 | Lipp |
| 5,061,823 A | 10/1991 | Carroll | 5,373,231 A | 12/1994 | Boll et al. |
| 5,065,089 A | 11/1991 | Rich | 5,374,938 A | 12/1994 | Hatazawa et al. |
| 5,065,092 A | 11/1991 | Sigler | 5,376,790 A | 12/1994 | Linker et al. |
| 5,066,357 A | 11/1991 | Smyth, Jr. et al. | 5,382,898 A | 1/1995 | Subramanian |
| 5,070,297 A | 12/1991 | Kwon et al. | 5,397,855 A | 3/1995 | Ferlier |
| 5,077,523 A | 12/1991 | Blanz | 5,404,111 A | 4/1995 | Mori et al. |
| 5,082,627 A | 1/1992 | Stanbro | 5,408,188 A | 4/1995 | Katoh |
| 5,084,671 A | 1/1992 | Miyata et al. | 5,408,189 A | 4/1995 | Swart et al. |
| 5,089,774 A | 2/1992 | Nakano | 5,410,259 A | 4/1995 | Fujihara et al. |
| 5,091,691 A | 2/1992 | Kamieniecki et al. | 5,412,330 A | 5/1995 | Ravel et al. |
| 5,091,692 A | 2/1992 | Ohno et al. | 5,412,866 A | 5/1995 | Woith et al. |
| 5,091,732 A | 2/1992 | Mileski et al. | 5,414,565 A | 5/1995 | Sullivan et al. |
| 5,094,536 A | 3/1992 | MacDonald et al. | 5,422,574 A | 6/1995 | Kister |
| 5,095,891 A | 3/1992 | Reitter | 5,434,512 A | 7/1995 | Schwindt et al. |
| 5,097,207 A | 3/1992 | Blanz | 5,448,172 A | 9/1995 | Dechene et al. |
| 5,101,149 A | 3/1992 | Adams et al. | 5,451,884 A | 9/1995 | Sauerland |
| 5,101,453 A | 3/1992 | Rumbaugh | 5,457,398 A | 10/1995 | Schwindt et al. |
| 5,103,169 A | 4/1992 | Heaton et al. | 5,461,328 A | 10/1995 | Devereaux et al. |
| 5,105,148 A | 4/1992 | Lee | 5,467,024 A | 11/1995 | Swapp |
| 5,105,181 A | 4/1992 | Ross | 5,469,324 A | 11/1995 | Henderson et al. |
| 5,107,076 A | 4/1992 | Bullock et al. | 5,475,316 A | 12/1995 | Hurley et al. |
| 5,136,237 A | 8/1992 | Smith et al. | 5,477,011 A | 12/1995 | Singles et al. |
| 5,142,224 A | 8/1992 | Smith et al. | 5,478,748 A | 12/1995 | Akins, Jr. et al. |
| 5,144,228 A | 9/1992 | Soma et al. | 5,479,108 A | 12/1995 | Cheng |
| 5,159,262 A | 10/1992 | Rumbaugh et al. | 5,479,109 A | 12/1995 | Lau et al. |
| 5,159,264 A | 10/1992 | Anderson | 5,481,196 A | 1/1996 | Nosov |
| 5,159,267 A | 10/1992 | Anderson | 5,481,936 A | 1/1996 | Yanagisawa |
| 5,159,752 A | 11/1992 | Mahant-Shetti et al. | 5,486,975 A | 1/1996 | Shamouilian et al. |
| 5,160,883 A | 11/1992 | Blanz | 5,488,954 A | 2/1996 | Sleva et al. |
| 5,164,319 A | 11/1992 | Hafeman et al. | 5,491,426 A | 2/1996 | Small |
| 5,164,661 A | 11/1992 | Jones | 5,493,070 A | 2/1996 | Habu |
| 5,166,606 A | 11/1992 | Blanz | 5,493,236 A | 2/1996 | Ishii et al. |
| 5,172,049 A | 12/1992 | Kiyokawa et al. | 5,500,606 A | 3/1996 | Holmes |

| | | | | | |
|---|---|---|---|---|---|
| 5,505,150 A | 4/1996 | James et al. | 5,798,652 A | 8/1998 | Taraci |
| 5,506,498 A | 4/1996 | Anderson et al. | 5,802,856 A | 9/1998 | Schaper et al. |
| 5,506,515 A | 4/1996 | Godshalk et al. | 5,804,982 A | 9/1998 | Lo et al. |
| 5,508,631 A | 4/1996 | Manku et al. | 5,804,983 A | 9/1998 | Nakajima et al. |
| 5,510,792 A | 4/1996 | Ono et al. | 5,807,107 A | 9/1998 | Bright et al. |
| 5,511,010 A | 4/1996 | Burns | 5,811,751 A | 9/1998 | Leong et al. |
| 5,512,835 A | 4/1996 | Rivera et al. | 5,824,494 A | 10/1998 | Feldberg |
| 5,515,167 A | 5/1996 | Ledger et al. | 5,828,225 A | 10/1998 | Obikane et al. |
| 5,517,111 A | 5/1996 | Shelor | 5,829,437 A | 11/1998 | Bridges |
| 5,521,522 A | 5/1996 | Abe et al. | 5,831,442 A | 11/1998 | Heigl |
| 5,523,694 A | 6/1996 | Cole, Jr. | 5,833,601 A | 11/1998 | Swartz et al. |
| 5,528,158 A | 6/1996 | Sinsheimer et al. | 5,835,997 A | 11/1998 | Yassine et al. |
| 5,530,371 A | 6/1996 | Perry et al. | 5,838,161 A | 11/1998 | Akram et al. |
| 5,530,372 A | 6/1996 | Lee et al. | 5,841,288 A | 11/1998 | Meaney et al. |
| 5,532,609 A | 7/1996 | Harwood et al. | 5,846,708 A | 12/1998 | Hollis et al. |
| 5,539,323 A | 7/1996 | Davis, Jr. | 5,847,569 A | 12/1998 | Ho et al. |
| 5,539,676 A | 7/1996 | Yamaguchi | 5,848,500 A | 12/1998 | Kirk |
| 5,546,012 A | 8/1996 | Perry et al. | 5,852,232 A | 12/1998 | Samsavar et al. |
| 5,550,480 A | 8/1996 | Nelson et al. | 5,854,608 A | 12/1998 | Leisten |
| 5,550,482 A | 8/1996 | Sano | 5,857,667 A | 1/1999 | Lee |
| 5,552,716 A | 9/1996 | Takahashi et al. | 5,861,743 A | 1/1999 | Pye et al. |
| 5,554,236 A | 9/1996 | Singles et al. | 5,867,073 A | 2/1999 | Weinreb et al. |
| 5,561,377 A | 10/1996 | Strid et al. | 5,869,326 A | 2/1999 | Hofmann |
| 5,561,585 A | 10/1996 | Barnes et al. | 5,869,975 A | 2/1999 | Strid et al. |
| 5,565,788 A | 10/1996 | Burr et al. | 5,874,361 A | 2/1999 | Collins et al. |
| 5,565,881 A | 10/1996 | Phillips et al. | 5,879,289 A | 3/1999 | Yarush et al. |
| 5,569,591 A | 10/1996 | Kell et al. | 5,883,522 A | 3/1999 | O'Boyle |
| 5,571,324 A | 11/1996 | Sago et al. | 5,883,523 A | 3/1999 | Ferland et al. |
| 5,572,398 A | 11/1996 | Federlin et al. | 5,888,075 A | 3/1999 | Hasegawa et al. |
| 5,578,932 A | 11/1996 | Adamian | 5,892,539 A | 4/1999 | Colvin |
| 5,583,445 A | 12/1996 | Mullen | 5,900,737 A | 5/1999 | Graham et al. |
| 5,584,608 A | 12/1996 | Gillespie | 5,903,143 A | 5/1999 | Mochizuki et al. |
| 5,594,358 A | 1/1997 | Ishikawa et al. | 5,905,421 A | 5/1999 | Oldfield |
| 5,600,256 A | 2/1997 | Woith et al. | 5,910,727 A | 6/1999 | Fujihara et al. |
| 5,604,444 A | 2/1997 | Harwood et al. | 5,916,689 A | 6/1999 | Collins et al. |
| 5,610,529 A | 3/1997 | Schwindt | 5,923,177 A | 7/1999 | Wardwell |
| 5,611,946 A | 3/1997 | Leong et al. | 5,926,028 A | 7/1999 | Mochizuki |
| 5,617,035 A | 4/1997 | Swapp | 5,942,907 A | 8/1999 | Chiang |
| 5,628,057 A | 5/1997 | Phillips et al. | 5,944,093 A | 8/1999 | Viswanath |
| 5,629,631 A | 5/1997 | Perry et al. | 5,945,836 A | 8/1999 | Sayre et al. |
| 5,631,571 A | 5/1997 | Spaziani et al. | 5,949,383 A | 9/1999 | Hayes et al. |
| 5,633,780 A | 5/1997 | Cronin | 5,949,579 A | 9/1999 | Baker |
| 5,640,101 A | 6/1997 | Kuji et al. | 5,952,842 A | 9/1999 | Fujimoto |
| 5,642,298 A | 6/1997 | Mallory et al. | 5,959,461 A | 9/1999 | Brown et al. |
| 5,644,248 A | 7/1997 | Fujimoto | 5,960,411 A | 9/1999 | Hartman et al. |
| 5,646,538 A | 7/1997 | Lide et al. | 5,963,027 A | 10/1999 | Peters |
| 5,653,939 A | 8/1997 | Hollis et al. | 5,963,364 A | 10/1999 | Leong et al. |
| 5,656,942 A | 8/1997 | Watts et al. | 5,970,429 A | 10/1999 | Martin |
| 5,657,394 A | 8/1997 | Schwartz et al. | 5,973,505 A | 10/1999 | Strid et al. |
| 5,659,255 A | 8/1997 | Strid et al. | 5,974,662 A | 11/1999 | Eldridge et al. |
| 5,659,421 A | 8/1997 | Rahmel et al. | 5,981,268 A | 11/1999 | Kovacs et al. |
| 5,663,653 A | 9/1997 | Schwindt et al. | 5,982,166 A | 11/1999 | Mautz |
| 5,666,063 A | 9/1997 | Abercrombie et al. | 5,993,611 A | 11/1999 | Moroney, III et al. |
| 5,668,470 A | 9/1997 | Shelor | 5,995,914 A | 11/1999 | Cabot |
| 5,669,316 A | 9/1997 | Faz et al. | 5,996,102 A | 11/1999 | Haulin |
| 5,670,322 A | 9/1997 | Eggers et al. | 5,998,768 A | 12/1999 | Hunter et al. |
| 5,670,888 A | 9/1997 | Cheng | 5,999,268 A | 12/1999 | Yonezawa et al. |
| 5,672,816 A | 9/1997 | Park et al. | 6,001,760 A | 12/1999 | Katsuda et al. |
| 5,675,499 A | 10/1997 | Lee et al. | 6,002,236 A | 12/1999 | Trant et al. |
| 5,675,932 A | 10/1997 | Mauney | 6,002,263 A | 12/1999 | Peters et al. |
| 5,676,360 A | 10/1997 | Boucher et al. | 6,002,426 A | 12/1999 | Back et al. |
| 5,680,039 A | 10/1997 | Mochizuki et al. | 6,013,586 A | 1/2000 | McGhee et al. |
| 5,682,337 A | 10/1997 | El-Fishawy et al. | 6,019,612 A | 2/2000 | Hasegawa et al. |
| 5,685,232 A | 11/1997 | Inoue | 6,023,209 A | 2/2000 | Faulkner et al. |
| 5,704,355 A | 1/1998 | Bridges | 6,028,435 A | 2/2000 | Nikawa |
| 5,712,571 A | 1/1998 | O'Donoghue | 6,029,141 A | 2/2000 | Bezos et al. |
| 5,715,819 A | 2/1998 | Svenson et al. | 6,031,383 A | 2/2000 | Streib et al. |
| 5,729,150 A | 3/1998 | Schwindt | 6,032,714 A | 3/2000 | Fenton |
| 5,731,708 A | 3/1998 | Sobhani | 6,034,533 A | 3/2000 | Tervo et al. |
| 5,731,920 A | 3/1998 | Katsuragawa | 6,037,785 A | 3/2000 | Higgins |
| 5,744,971 A | 4/1998 | Chan et al. | 6,037,793 A | 3/2000 | Miyazawa et al. |
| 5,748,506 A | 5/1998 | Bockelman | 6,043,667 A | 3/2000 | Cadwallader et al. |
| 5,751,252 A | 5/1998 | Phillips | 6,043,668 A | 3/2000 | Carney |
| 5,767,690 A | 6/1998 | Fujimoto | 6,049,216 A | 4/2000 | Yang et al. |
| 5,773,951 A | 6/1998 | Markowski et al. | 6,051,422 A | 4/2000 | Kovacs et al. |
| 5,777,485 A | 7/1998 | Tanaka et al. | 6,052,653 A | 4/2000 | Mazur et al. |
| 5,792,668 A | 8/1998 | Fuller et al. | 6,054,869 A | 4/2000 | Hutton et al. |
| 5,793,213 A | 8/1998 | Bockelman et al. | 6,060,888 A | 5/2000 | Blackham et al. |
| 5,794,133 A | 8/1998 | Kashima | 6,060,891 A | 5/2000 | Hembree et al. |

| Patent No. | Kind | Date | Inventor |
|---|---|---|---|
| 6,060,892 | A | 5/2000 | Yamagata |
| 6,061,589 | A | 5/2000 | Bridges et al. |
| 6,064,213 | A | 5/2000 | Khandros et al. |
| 6,064,217 | A | 5/2000 | Smith |
| 6,064,218 | A | 5/2000 | Godfrey et al. |
| 6,066,911 | A | 5/2000 | Lindemann et al. |
| 6,078,183 | A | 6/2000 | Cole, Jr. |
| 6,091,236 | A | 7/2000 | Piety et al. |
| 6,091,255 | A | 7/2000 | Godfrey |
| 6,096,567 | A | 8/2000 | Kaplan et al. |
| 6,100,815 | A | 8/2000 | Pailthorp |
| 6,104,203 | A | 8/2000 | Costello et al. |
| 6,104,206 | A | 8/2000 | Verkuil |
| 6,111,419 | A | 8/2000 | Lefever et al. |
| 6,114,865 | A | 9/2000 | Lagowski et al. |
| 6,118,287 | A | 9/2000 | Boll et al. |
| 6,118,894 | A | 9/2000 | Schwartz et al. |
| 6,121,783 | A | 9/2000 | Horner et al. |
| 6,124,723 | A | 9/2000 | Costello |
| 6,124,725 | A | 9/2000 | Sato |
| 6,127,831 | A | 10/2000 | Khoury et al. |
| 6,130,544 | A | 10/2000 | Strid et al. |
| 6,137,302 | A | 10/2000 | Schwindt |
| 6,137,303 | A | 10/2000 | Deckert et al. |
| 6,144,212 | A | 11/2000 | Mizuta |
| 6,147,502 | A | 11/2000 | Fryer et al. |
| 6,147,851 | A | 11/2000 | Anderson |
| 6,160,407 | A | 12/2000 | Nikawa |
| 6,161,294 | A | 12/2000 | Bland et al. |
| 6,166,553 | A | 12/2000 | Sinsheimer |
| 6,169,410 | B1 | 1/2001 | Grace et al. |
| 6,172,337 | B1 | 1/2001 | Johnsgard et al. |
| 6,175,228 | B1 | 1/2001 | Zamborelli et al. |
| 6,181,144 | B1 | 1/2001 | Hembree et al. |
| 6,181,149 | B1 | 1/2001 | Godfrey et al. |
| 6,181,297 | B1 | 1/2001 | Leisten |
| 6,181,416 | B1 | 1/2001 | Falk |
| 6,184,845 | B1 | 2/2001 | Leisten et al. |
| 6,191,596 | B1 | 2/2001 | Abiko |
| 6,194,720 | B1 | 2/2001 | Li et al. |
| 6,194,907 | B1 | 2/2001 | Kanao et al. |
| 6,198,299 | B1 | 3/2001 | Hollman |
| 6,211,663 | B1 | 4/2001 | Moulthrop et al. |
| 6,211,837 | B1 | 4/2001 | Crouch et al. |
| 6,215,295 | B1 | 4/2001 | Smith, III |
| 6,222,031 | B1 | 4/2001 | Wakabayashi et al. |
| 6,222,970 | B1 | 4/2001 | Wach et al. |
| 6,229,322 | B1 | 5/2001 | Hembree |
| 6,229,327 | B1 | 5/2001 | Boll et al. |
| 6,232,787 | B1 | 5/2001 | Lo et al. |
| 6,232,788 | B1 | 5/2001 | Schwindt et al. |
| 6,232,789 | B1 | 5/2001 | Schwindt |
| 6,232,790 | B1 | 5/2001 | Bryan et al. |
| 6,233,613 | B1 | 5/2001 | Walker et al. |
| 6,236,223 | B1 | 5/2001 | Brady et al. |
| 6,236,975 | B1 | 5/2001 | Boe et al. |
| 6,236,977 | B1 | 5/2001 | Verba et al. |
| 6,242,929 | B1 | 6/2001 | Mizuta |
| 6,245,692 | B1 | 6/2001 | Pearce et al. |
| 6,251,595 | B1 | 6/2001 | Gordon et al. |
| 6,252,392 | B1 | 6/2001 | Peters |
| 6,257,319 | B1 | 7/2001 | Kainuma et al. |
| 6,257,564 | B1 | 7/2001 | Avneri et al. |
| 6,259,261 | B1 | 7/2001 | Engelking et al. |
| 6,265,950 | B1 | 7/2001 | Schmidt et al. |
| 6,271,673 | B1 | 8/2001 | Furuta et al. |
| 6,275,738 | B1 | 8/2001 | Kasevich et al. |
| 6,278,051 | B1 | 8/2001 | Peabody |
| 6,278,411 | B1 | 8/2001 | Ohlsson et al. |
| 6,281,691 | B1 | 8/2001 | Matsunaga et al. |
| 6,284,971 | B1 | 9/2001 | Atalar et al. |
| 6,288,557 | B1 | 9/2001 | Peters et al. |
| 6,292,760 | B1 | 9/2001 | Burns |
| 6,300,775 | B1 | 10/2001 | Peach et al. |
| 6,307,672 | B1 | 10/2001 | DeNure |
| 6,310,483 | B1 | 10/2001 | Taura et al. |
| 6,310,755 | B1 | 10/2001 | Kholodenko et al. |
| 6,313,567 | B1 | 11/2001 | Maltabes et al. |
| 6,313,649 | B2 | 11/2001 | Harwood et al. |
| 6,320,372 | B1 | 11/2001 | Keller |
| 6,320,396 | B1 | 11/2001 | Nikawa |
| 6,327,034 | B1 | 12/2001 | Hoover et al. |
| 6,335,625 | B1 | 1/2002 | Bryant et al. |
| 6,335,628 | B2 | 1/2002 | Schwindt et al. |
| 6,340,568 | B2 | 1/2002 | Hefti |
| 6,340,895 | B1 | 1/2002 | Uher et al. |
| 6,359,456 | B1 | 3/2002 | Hembree et al. |
| 6,362,636 | B1 | 3/2002 | Peters et al. |
| 6,362,792 | B1 | 3/2002 | Sawamura et al. |
| 6,366,247 | B1 | 4/2002 | Sawamura et al. |
| 6,369,776 | B1 | 4/2002 | Leisten et al. |
| 6,376,258 | B2 | 4/2002 | Hefti |
| 6,380,751 | B2 | 4/2002 | Harwood et al. |
| 6,384,614 | B1 | 5/2002 | Hager et al. |
| 6,395,480 | B1 | 5/2002 | Hefti |
| 6,396,296 | B1 | 5/2002 | Tarter et al. |
| 6,396,298 | B1 | 5/2002 | Young et al. |
| 6,400,168 | B2 | 6/2002 | Matsunaga et al. |
| 6,404,213 | B2 | 6/2002 | Noda |
| 6,407,560 | B1 | 6/2002 | Walraven et al. |
| 6,407,562 | B1 | 6/2002 | Whiteman |
| 6,409,724 | B1 | 6/2002 | Penny et al. |
| 6,414,478 | B1 | 7/2002 | Suzuki |
| 6,415,858 | B1 | 7/2002 | Getchel et al. |
| 6,418,009 | B1 | 7/2002 | Brunette |
| 6,420,722 | B2 | 7/2002 | Moore et al. |
| 6,424,141 | B1 | 7/2002 | Hollman et al. |
| 6,424,316 | B1 | 7/2002 | Leisten |
| 6,445,202 | B1 | 9/2002 | Cowan et al. |
| 6,447,339 | B1 | 9/2002 | Reed et al. |
| 6,448,788 | B1 | 9/2002 | Meaney et al. |
| 6,459,739 | B1 | 10/2002 | Vitenberg |
| 6,466,046 | B1 | 10/2002 | Maruyama et al. |
| 6,468,816 | B2 | 10/2002 | Hunter |
| 6,476,442 | B1 | 11/2002 | Williams et al. |
| 6,480,013 | B1 | 11/2002 | Nayler et al. |
| 6,481,939 | B1 | 11/2002 | Gillespie et al. |
| 6,483,327 | B1 | 11/2002 | Bruce et al. |
| 6,483,336 | B1 | 11/2002 | Harris et al. |
| 6,486,687 | B2 | 11/2002 | Harwood et al. |
| 6,488,405 | B1 | 12/2002 | Eppes et al. |
| 6,489,789 | B2 | 12/2002 | Peters et al. |
| 6,490,471 | B2 | 12/2002 | Svenson et al. |
| 6,492,822 | B2 | 12/2002 | Schwindt et al. |
| 6,501,289 | B1 | 12/2002 | Takekoshi |
| 6,512,391 | B2 | 1/2003 | Cowan et al. |
| 6,512,482 | B1 | 1/2003 | Nelson et al. |
| 6,515,494 | B1 | 2/2003 | Low |
| 6,528,993 | B1 | 3/2003 | Shin et al. |
| 6,529,844 | B1 | 3/2003 | Kapetanic et al. |
| 6,548,311 | B1 | 4/2003 | Knoll |
| 6,549,022 | B1 | 4/2003 | Cole, Jr. et al. |
| 6,549,026 | B1 | 4/2003 | DiBattista et al. |
| 6,549,106 | B2 | 4/2003 | Martin |
| 6,566,079 | B2 | 5/2003 | Hefti |
| 6,573,702 | B2 | 6/2003 | Marcuse et al. |
| 6,578,264 | B1 | 6/2003 | Gleason et al. |
| 6,580,283 | B1 | 6/2003 | Carbone et al. |
| 6,582,979 | B2 | 6/2003 | Coccioli et al. |
| 6,587,327 | B1 | 7/2003 | Devoe et al. |
| 6,603,322 | B1 | 8/2003 | Boll et al. |
| 6,605,951 | B1 | 8/2003 | Cowan |
| 6,605,955 | B1 | 8/2003 | Costello et al. |
| 6,608,494 | B1 | 8/2003 | Bruce et al. |
| 6,608,496 | B1 | 8/2003 | Strid et al. |
| 6,611,417 | B2 | 8/2003 | Chen |
| 6,617,862 | B1 | 9/2003 | Bruce |
| 6,621,082 | B2 | 9/2003 | Morita et al. |
| 6,624,891 | B2 | 9/2003 | Marcus et al. |
| 6,627,461 | B2 | 9/2003 | Chapman et al. |
| 6,628,503 | B2 | 9/2003 | Sogard |
| 6,628,980 | B2 | 9/2003 | Atalar et al. |
| 6,633,174 | B1 | 10/2003 | Satya et al. |
| 6,636,059 | B2 | 10/2003 | Harwood et al. |
| 6,636,182 | B2 | 10/2003 | Mehltretter |
| 6,639,415 | B2 | 10/2003 | Peters et al. |
| 6,639,461 | B1 | 10/2003 | Tam et al. |
| 6,642,732 | B2 | 11/2003 | Cowan et al. |

| | | |
|---|---|---|
| 6,643,597 B1 | 11/2003 | Dunsmore |
| 6,650,135 B1 | 11/2003 | Mautz et al. |
| 6,653,903 B2 | 11/2003 | Leich et al. |
| 6,657,214 B1 | 12/2003 | Foegelle et al. |
| 6,657,601 B2 | 12/2003 | McLean |
| 6,688,753 B2 | 2/2004 | Calon et al. |
| 6,701,265 B1 | 3/2004 | Hill et al. |
| 6,707,548 B2 | 3/2004 | Kreimer et al. |
| 6,710,798 B1 | 3/2004 | Hershel et al. |
| 6,717,426 B2 | 4/2004 | Iwasaki |
| 6,720,782 B2 | 4/2004 | Schwindt et al. |
| 6,724,205 B1 | 4/2004 | Hayden et al. |
| 6,724,928 B1 | 4/2004 | Davis |
| 6,727,716 B1 | 4/2004 | Sharif |
| 6,731,804 B1 | 5/2004 | Carrieri et al. |
| 6,734,687 B1 | 5/2004 | Ishitani et al. |
| 6,737,920 B2 | 5/2004 | Jen et al. |
| 6,739,208 B2 | 5/2004 | Hyakudomi |
| 6,744,268 B2 | 6/2004 | Hollman |
| 6,753,679 B1 | 6/2004 | Kwong et al. |
| 6,753,699 B2 | 6/2004 | Stockstad |
| 6,756,751 B2 | 6/2004 | Hunter |
| 6,768,328 B2 | 7/2004 | Self et al. |
| 6,770,955 B1 | 8/2004 | Coccioli et al. |
| 6,771,090 B2 | 8/2004 | Harris et al. |
| 6,771,806 B1 | 8/2004 | Satya et al. |
| 6,774,651 B1 | 8/2004 | Hembree |
| 6,777,964 B2 | 8/2004 | Navratil et al. |
| 6,778,140 B1 | 8/2004 | Yeh |
| 6,784,679 B2 | 8/2004 | Sweet et al. |
| 6,788,093 B2 | 9/2004 | Aitren et al. |
| 6,791,344 B2 | 9/2004 | Cook et al. |
| 6,794,888 B2 | 9/2004 | Kawaguchi et al. |
| 6,794,950 B2 | 9/2004 | Du Toit et al. |
| 6,798,226 B2 | 9/2004 | Altmann et al. |
| 6,801,047 B2 | 10/2004 | Harwood et al. |
| 6,803,779 B2 | 10/2004 | Strid et al. |
| 6,806,724 B2 | 10/2004 | Hayden et al. |
| 6,806,836 B2 | 10/2004 | Ogawa et al. |
| 6,809,533 B1 | 10/2004 | Anlage et al. |
| 6,812,718 B1 | 11/2004 | Chong et al. |
| 6,822,463 B1 | 11/2004 | Jacobs |
| 6,836,135 B2 | 12/2004 | Harris et al. |
| 6,838,885 B2 | 1/2005 | Kamitani |
| 6,842,024 B2 | 1/2005 | Peters et al. |
| 6,843,024 B2 | 1/2005 | Nozaki et al. |
| 6,847,219 B1 | 1/2005 | Lesher et al. |
| 6,856,129 B2 | 2/2005 | Thomas et al. |
| 6,861,856 B2 | 3/2005 | Dunklee et al. |
| 6,864,694 B2 | 3/2005 | McTigue |
| 6,873,167 B2 | 3/2005 | Goto et al. |
| 6,885,197 B2 | 4/2005 | Harris et al. |
| 6,900,646 B2 | 5/2005 | Kasukabe et al. |
| 6,900,647 B2 | 5/2005 | Yoshida et al. |
| 6,900,652 B2 | 5/2005 | Mazur |
| 6,900,653 B2 | 5/2005 | Yu et al. |
| 6,902,941 B2 | 6/2005 | Sun |
| 6,903,563 B2 | 6/2005 | Yoshida et al. |
| 6,914,244 B2 | 7/2005 | Alani |
| 6,914,423 B2 | 7/2005 | Nordgren et al. |
| 6,914,580 B2 | 7/2005 | Leisten |
| 6,924,656 B2 | 8/2005 | Matsumoto |
| 6,927,079 B1 | 8/2005 | Fyfield |
| 6,937,341 B1 | 8/2005 | Woollam et al. |
| 6,965,226 B2 | 11/2005 | Dunklee |
| 6,970,001 B2 | 11/2005 | Chheda et al. |
| 6,980,012 B2 | 12/2005 | Schwindt |
| 6,987,398 B2 | 1/2006 | Strid |
| 6,987,483 B2 | 1/2006 | Tran |
| 7,001,785 B1 | 2/2006 | Chen |
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,019,701 B2 | 3/2006 | Ohno et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,229 B2 | 4/2006 | Maesaki et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,599 B2 | 4/2006 | Douglas |
| 7,030,827 B2 | 4/2006 | Mahler et al. |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 7,088,981 B2 | 8/2006 | Chang |
| 7,096,133 B1 | 8/2006 | Martin et al. |
| 7,101,797 B2 | 9/2006 | Yuasa |
| 7,138,810 B2 | 11/2006 | Lesher |
| 7,138,813 B2 | 11/2006 | Cowan et al. |
| 7,164,279 B2 | 1/2007 | Strid et al. |
| 7,176,705 B2 | 2/2007 | Rumbaugh |
| 7,187,188 B2 | 3/2007 | Andrews et al. |
| 7,188,037 B2 | 3/2007 | Hidehira |
| 7,190,181 B2 | 3/2007 | Peters et al. |
| 7,221,146 B2 | 5/2007 | Dunklee |
| 7,221,172 B2 | 5/2007 | Dunklee |
| 7,250,626 B2 | 7/2007 | Lesher |
| 7,250,752 B2 | 7/2007 | Peters et al. |
| 7,250,779 B2 | 7/2007 | Dunklee et al. |
| 7,268,533 B2 | 9/2007 | Harris et al. |
| 7,292,057 B2 | 11/2007 | Cowan |
| 7,295,025 B2 | 11/2007 | Lesher |
| 7,321,233 B2 | 1/2008 | Strid et al. |
| 7,330,023 B2 | 2/2008 | Schwindt et al. |
| 7,330,041 B2 | 2/2008 | McFaddin |
| 7,348,787 B2 | 3/2008 | Harwood et al. |
| 7,352,168 B2 | 4/2008 | Dunklee |
| 7,362,115 B2 | 4/2008 | Andrews et al. |
| 7,368,925 B2 | 5/2008 | Navratil et al. |
| 7,423,419 B2 | 9/2008 | Dunklee |
| 7,436,170 B2 | 10/2008 | Peters et al. |
| 7,468,609 B2 | 12/2008 | Dunklee |
| 7,492,147 B2 | 2/2009 | Schwindt et al. |
| 7,492,172 B2 | 2/2009 | Stewart et al. |
| 7,498,828 B2 | 3/2009 | Dunklee et al. |
| 7,501,810 B2 | 3/2009 | Dunklee |
| 7,504,823 B2 | 3/2009 | Rumbaugh |
| 7,514,915 B2 | 4/2009 | Dunklee |
| 7,518,358 B2 | 4/2009 | Dunklee |
| 7,550,984 B2 | 6/2009 | Lesher et al. |
| 7,554,322 B2 | 6/2009 | Nordfren et al. |
| 2001/0002794 A1 | 6/2001 | Draving et al. |
| 2001/0009377 A1 | 7/2001 | Schwindt et al. |
| 2001/0010468 A1 | 8/2001 | Gleason et al. |
| 2001/0020283 A1 | 9/2001 | Sakaguchi |

| | | |
|---|---|---|
| 2001/0024116 A1 | 9/2001 | Draving |
| 2001/0030549 A1 | 10/2001 | Gleason et al. |
| 2001/0043073 A1 | 11/2001 | Montoya |
| 2001/0044152 A1 | 11/2001 | Burnett |
| 2001/0045511 A1 | 11/2001 | Moore et al. |
| 2001/0054906 A1 | 12/2001 | Fujimura |
| 2002/0005728 A1 | 1/2002 | Babson et al. |
| 2002/0008533 A1 | 1/2002 | Ito et al. |
| 2002/0009377 A1 | 1/2002 | Shafer |
| 2002/0009378 A1 | 1/2002 | Obara |
| 2002/0011859 A1 | 1/2002 | Smith et al. |
| 2002/0011863 A1 | 1/2002 | Takahashi et al. |
| 2002/0050828 A1 | 5/2002 | Seward, IV et al. |
| 2002/0066551 A1 | 6/2002 | Stone et al. |
| 2002/0070743 A1 | 6/2002 | Felici et al. |
| 2002/0070745 A1 | 6/2002 | Johnson et al. |
| 2002/0075027 A1 | 6/2002 | Hollman et al. |
| 2002/0079911 A1 | 6/2002 | Schwindt |
| 2002/0118009 A1 | 8/2002 | Hollman et al. |
| 2002/0118034 A1 | 8/2002 | Laureanti |
| 2002/0149377 A1 | 10/2002 | Hefti et al. |
| 2002/0153909 A1 | 10/2002 | Petersen et al. |
| 2002/0163769 A1 | 11/2002 | Brown |
| 2002/0168659 A1 | 11/2002 | Hefti et al. |
| 2002/0180466 A1 | 12/2002 | Hiramatsu et al. |
| 2002/0197709 A1 | 12/2002 | Van der Weide et al. |
| 2003/0010877 A1 | 1/2003 | Landreville et al. |
| 2003/0030822 A1 | 2/2003 | Finarov |
| 2003/0032000 A1 | 2/2003 | Liu et al. |
| 2003/0040004 A1 | 2/2003 | Hefti et al. |
| 2003/0057513 A1 | 3/2003 | Leedy |
| 2003/0062915 A1 | 4/2003 | Arnold et al. |
| 2003/0071631 A1 | 4/2003 | Alexander |
| 2003/0072549 A1 | 4/2003 | Facer et al. |
| 2003/0077649 A1 | 4/2003 | Cho et al. |
| 2003/0088180 A1 | 5/2003 | VanVeen et al. |
| 2003/0119057 A1 | 6/2003 | Gascoyne et al. |
| 2003/0139662 A1 | 7/2003 | Seidman |
| 2003/0139790 A1 | 7/2003 | Ingle et al. |
| 2003/0141861 A1 | 7/2003 | Navratil et al. |
| 2003/0155939 A1 | 8/2003 | Lutz et al. |
| 2003/0156270 A1 | 8/2003 | Hunter |
| 2003/0170898 A1 | 9/2003 | Gundersen et al. |
| 2003/0184332 A1 | 10/2003 | Tomimatsu et al. |
| 2004/0015060 A1 | 1/2004 | Samsoondar et al. |
| 2004/0021475 A1 | 2/2004 | Ito et al. |
| 2004/0061514 A1 | 4/2004 | Schwindt et al. |
| 2004/0066181 A1 | 4/2004 | Thies |
| 2004/0069776 A1 | 4/2004 | Fagrell et al. |
| 2004/0090223 A1 | 5/2004 | Yonezawa |
| 2004/0095145 A1 | 5/2004 | Boudiaf et al. |
| 2004/0095641 A1 | 5/2004 | Russum et al. |
| 2004/0100276 A1 | 5/2004 | Fanton |
| 2004/0100297 A1 | 5/2004 | Tanioka et al. |
| 2004/0108847 A1 | 6/2004 | Stoll et al. |
| 2004/0113639 A1 | 6/2004 | Dunklee et al. |
| 2004/0113640 A1 | 6/2004 | Cooper et al. |
| 2004/0130787 A1 | 7/2004 | Thome-Forster et al. |
| 2004/0132222 A1 | 7/2004 | Hembree et al. |
| 2004/0134899 A1 | 7/2004 | Hiramatsu et al. |
| 2004/0147034 A1 | 7/2004 | Gore et al. |
| 2004/0162689 A1 | 8/2004 | Jamneala et al. |
| 2004/0175294 A1 | 9/2004 | Ellison et al. |
| 2004/0186382 A1 | 9/2004 | Modell et al. |
| 2004/0193382 A1 | 9/2004 | Adamian et al. |
| 2004/0197771 A1 | 10/2004 | Powers et al. |
| 2004/0199350 A1 | 10/2004 | Blackham et al. |
| 2004/0207072 A1 | 10/2004 | Hiramatsu et al. |
| 2004/0207424 A1 | 10/2004 | Hollman |
| 2004/0239338 A1 | 12/2004 | Jonsson et al. |
| 2004/0246004 A1 | 12/2004 | Heuermann |
| 2004/0251922 A1 | 12/2004 | Martens et al. |
| 2004/0267691 A1 | 12/2004 | Vasudeva |
| 2005/0024069 A1 | 2/2005 | Hayden et al. |
| 2005/0026276 A1 | 2/2005 | Chou |
| 2005/0030047 A1 | 2/2005 | Adamian |
| 2005/0054029 A1 | 3/2005 | Tomimatsu et al. |
| 2005/0062533 A1 | 3/2005 | Vice |
| 2005/0083130 A1 | 4/2005 | Grilo |
| 2005/0099192 A1 | 5/2005 | Dunklee et al. |
| 2005/0101846 A1 | 5/2005 | Fine et al. |
| 2005/0127927 A1 | 6/2005 | Harris |
| 2005/0156675 A1 | 7/2005 | Rohde et al. |
| 2005/0164160 A1 | 7/2005 | Gunter et al. |
| 2005/0165316 A1 | 7/2005 | Lowery et al. |
| 2005/0168722 A1 | 8/2005 | Forstner et al. |
| 2005/0174191 A1 | 8/2005 | Brunker et al. |
| 2005/0178980 A1 | 8/2005 | Skidmore et al. |
| 2005/0184744 A1 | 8/2005 | Schwindt et al. |
| 2005/0195124 A1 | 9/2005 | Puente Baliarda et al. |
| 2005/0227503 A1 | 10/2005 | Reitinger |
| 2005/0236587 A1 | 10/2005 | Kodama et al. |
| 2005/0237102 A1 | 10/2005 | Tanaka |
| 2006/0052075 A1 | 3/2006 | Galivanche et al. |
| 2006/0114012 A1 | 6/2006 | Reitinger |
| 2006/0155270 A1 | 7/2006 | Hancock et al. |
| 2006/0158207 A1 | 7/2006 | Reitinger |
| 2006/0226864 A1 | 10/2006 | Kramer |
| 2007/0024506 A1 | 2/2007 | Hardacker |
| 2007/0030021 A1 | 2/2007 | Cowan et al. |
| 2007/0194778 A1 | 8/2007 | Dunklee et al. |
| 2007/0273387 A1 | 11/2007 | Harris et al. |
| 2007/0294047 A1 | 12/2007 | Hayden |
| 2008/0012578 A1 | 1/2008 | Campbell |
| 2008/0042374 A1 | 2/2008 | Dunklee |
| 2008/0042376 A1 | 2/2008 | Nordgren et al. |
| 2008/0042642 A1 | 2/2008 | Dunklee |
| 2008/0042669 A1 | 2/2008 | Nordgren et al. |
| 2008/0042670 A1 | 2/2008 | Nordgren et al. |
| 2008/0042675 A1 | 2/2008 | Navratil et al. |
| 2008/0042680 A1 | 2/2008 | Cowan et al. |
| 2008/0048693 A1 | 2/2008 | Peters et al. |
| 2008/0054884 A1 | 3/2008 | Dunklee |
| 2008/0054885 A1 | 3/2008 | Dunklee |
| 2008/0106290 A1 | 5/2008 | Harwood et al. |
| 2008/0157796 A1 | 7/2008 | Andrews et al. |
| 2008/0218187 A1 | 9/2008 | Lesher |
| 2009/0153167 A1 | 6/2009 | Stewart et al. |

FOREIGN PATENT DOCUMENTS

| | | |
|---|---|---|
| DE | 2912826 | 10/1980 |
| DE | 3114466 | 3/1982 |
| DE | 3125552 | 11/1982 |
| DE | 3637549 | 5/1988 |
| DE | 288 234 | 3/1991 |
| DE | 4109908 | 10/1992 |
| DE | 4316111 | 11/1994 |
| DE | 9406227 | 8/1995 |
| DE | 19541334 | 9/1996 |
| DE | 19616212 | 10/1996 |
| DE | 19522774 | 1/1997 |
| DE | 19618717 | 1/1998 |
| DE | 69322206 | 4/1999 |
| DE | 10000324 | 7/2001 |
| EP | 0087497 | 9/1983 |
| EP | 0201205 | 12/1986 |
| EP | 0314481 | 5/1989 |
| EP | 0333521 | 9/1989 |
| EP | 0460911 | 12/1991 |
| EP | 0574149 | 12/1993 |
| EP | 0706210 | 4/1996 |
| EP | 0505981 | 6/1998 |
| EP | 0573183 | 1/1999 |
| EP | 0945736 | 9/1999 |
| GB | 2 197 081 | 5/1988 |
| JP | 53-037077 | 4/1978 |
| JP | 53-052354 | 5/1978 |
| JP | 55-115383 | 9/1980 |
| JP | 56-007439 | 1/1981 |
| JP | 56-88333 | 7/1981 |
| JP | 57-075480 | 5/1982 |
| JP | 57-163035 | 10/1982 |
| JP | 62-11243 | 1/1987 |
| JP | 62-51235 | 3/1987 |
| JP | 62-098634 | 5/1987 |
| JP | 62-107937 | 5/1987 |
| JP | 62-239050 | 10/1987 |
| JP | 63-108736 | 5/1988 |

| | | |
|---|---|---|
| JP | 63-129640 | 6/1988 |
| JP | 63-143814 | 6/1988 |
| JP | 63-160355 | 7/1988 |
| JP | 83-318745 | 12/1988 |
| JP | 1-165968 | 6/1989 |
| JP | 1-178872 | 7/1989 |
| JP | 1-209380 | 8/1989 |
| JP | 1-214038 | 8/1989 |
| JP | 1-219575 | 9/1989 |
| JP | 1-296167 | 11/1989 |
| JP | 2-22836 | 1/1990 |
| JP | 2-022837 | 1/1990 |
| JP | 2-022873 | 1/1990 |
| JP | 2-124469 | 5/1990 |
| JP | 2-191352 | 7/1990 |
| JP | 2-220453 | 9/1990 |
| JP | 3-067187 | 3/1991 |
| JP | 3-175367 | 7/1991 |
| JP | 3-196206 | 8/1991 |
| JP | 03-228348 | 10/1991 |
| JP | 4-000732 | 1/1992 |
| JP | 04-130639 | 5/1992 |
| JP | 04-159043 | 6/1992 |
| JP | 04-206930 | 7/1992 |
| JP | 4-340248 | 11/1992 |
| JP | 5-008476 | 1/1993 |
| JP | 05-082631 | 4/1993 |
| JP | 5-157790 | 6/1993 |
| JP | 5-166893 | 7/1993 |
| JP | 6-085044 | 3/1994 |
| JP | 60-71425 | 3/1994 |
| JP | 6-102313 | 4/1994 |
| JP | 6-132709 | 5/1994 |
| JP | 7-005078 | 1/1995 |
| JP | 7-005197 | 1/1995 |
| JP | 7-12871 | 1/1995 |
| JP | 7-084003 | 3/1995 |
| JP | 7-273509 | 10/1995 |
| JP | 8-35987 | 2/1996 |
| JP | 8-261898 | 10/1996 |
| JP | 08-330401 | 12/1996 |
| JP | 10-116866 | 5/1998 |
| JP | 10-339743 | 12/1998 |
| JP | 11-023975 | 1/1999 |
| JP | 11-031724 | 2/1999 |
| JP | 2000-329664 | 11/2000 |
| JP | 2001-124676 | 5/2001 |
| JP | 2001-189285 | 7/2001 |
| JP | 2001-189378 | 7/2001 |
| JP | 2002-033374 | 1/2002 |
| JP | 2002/164396 | 6/2002 |
| JP | 2002-203879 | 7/2002 |
| JP | 2002-243502 | 8/2002 |
| SU | 843040 | 6/1981 |
| SU | 1392603 | 4/1988 |
| WO | WO 80/00101 | 1/1980 |
| WO | WO 86/07493 | 12/1986 |
| WO | WO 89/04001 | 5/1989 |
| WO | WO 01/69656 | 9/2001 |
| WO | WO 2004/049395 | 6/2004 |
| WO | WO 2004/065944 | 8/2004 |
| WO | WO 2004/079299 | 9/2004 |
| WO | WO 2005/062025 | 7/2005 |

OTHER PUBLICATIONS

Daniel Vanderweide, "THz Frequency Science & Technology Biomolecular Interaction Sensing with Sub-Terahertz Fields," University of Wisconsin-Madison, 2 pages, date unknown.
L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.
Sam Hanash, "insight review articles, Disease proteomics," Nature, Vol. 422, Mar. 13, 2003, pp. 226-232.
Mike Tyers and Matthias Mann, "insight overview, From genomics to proteomics," Nature, vol. 422, Mar. 13, 2003, pp. 193-197.
Andrej Sali, Robert Glaeser, Thomas Earnest, and Wolfgang Baumeister, "insight: review article From words to literature in structural proteomics," Nature 422, 216-225 (2003); doi: 10.1038/nature01513, Mar. 13, 2003.
Ruedi Aebersold and Matthias Mann, "insight review articles, Mass spectrometry-based proteomics," Nature, vol. 422, Mar. 13, 2003, pp. 198-207.
Barbara Marte, Senior Editor, "Nature insight Proteomics," Nature vol. 422, Mar. 13, 2003 pp. 191-194.
Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512, Mar. 13, 2003.
Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.
Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.
Christophe Risacher, et al., "Wavequide-to-Microstrip Transition With Integrated Bias-T," IEEE Microwave and Wireless Components Letters, vol. 13, No. 7, Jul. 2003, pp. 262-264.
Saswata Basu and Leonard Hayden, "An SOLR Calibration for Accurate Measurement of Orthogonal On-Wafer DUTS," 1997 IEEE MTT-S Digest, pp. 1335-1338.
J. Martens, "Multiport SOLR Calibrations: Performance and an Analysis of Some Standards Dependencies," pp. 205-213, Anritsu Company, 490 Jarvis Drive, Morgan Hill, CA 95037, jmartens@anritsu.com.
Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.
Mohammed Nurul Afsar, James R. Birch, and R. N. Clarke, "The Measurement of the Properties of Materials," Proceedings of the IEEE, vol. 74, No. 1, Jan. 1986, pp. 183-199.
M.S. Venkatesh and G.S.V. Raghavan, "An overview of dielectric properties measuring techniques," vol. 47, 2005, Canadian Biosystems Engineering, pp. 7.15-7.30.
Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.
Leonard Hayden, "A Multi-Line TRL Calibration," Feb. 2, 1994, 5 pages.
Christophe Seguinot, et al., "Multimode TRL—A New concept in Microwave Measurements: Theory and Experimental Verification," IEEE Transactions on Microwave Theory and Techniques, vol. 46, No. 5, May 1998, pp. 536-542.
Roberto Tinti, Franz Sischka, and Chris Morton, "Proposed System Solution for 1/f Noise Parameter Extraction," Agilent Technolocies Comms EDA, 1400 Fountaingrove Pkw, Santa Rosa, CA 95403, 7 pages.
Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Insitute of Physics, pp. 1354-1356.
Cascade Microtech, "Probe Heads Care and cleaning of coaxial input microwave probes," Microwave Probe Care and Cleaning, Instruction Manual, Copyright 1990.
John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.
Cascade Microtech, "Introducing the peak of analytical probe stations," MicroProbe Update, May 1990.
H.-J. Eul and B. Schiek, "Thru-Match-Reflect: One Result of a Rigorous Theory for De-Embedding and Network Analyzer Calibration," 18th Euopean Microwave Conference '88, The International Conference Designed for the Microwave Community, Published by Microwave Exhibitions and Publishers Limited, Sep. 12-16, 1988, Stockholm, Sweden.

Cascade Microtech, "Analytical Probe Station," Summit 9000 Series, Jun. 1, 1990.

Maury Microwave Corporation, "MT950D Series, Transistor Test Fixture Software, Software Application Packs," Sep. 20, 1982.

Signatone S-1240 Thermal Controller, 2 page description.

The Micromanipulator Company, "Semi-Automatic Probing Stations and Accessories," pp. 1-12.

Integrated Technology Corporation, "Probilt PB500A Probe Card Repair and Analysis Station," 4 pages.

Brian J. Clifton, "Precision slotted-Line Impedance Measurements Using computer Simulation for Data Correction," IEEE Transactions on Instrumentation and Measurement, vol. IM-19, No. 4, Nov. 1970, pp. 358-363.

Eric Strid (Cascade Microtech), "Planar Impedance Standards and Accuracy Considerations in Vector Network Analysis," Jun. 1986, 8 pages.

Maury Microwave Corporation, "MT950 Series Transistor Test Fixture (TTF) Notice! Notice! Notice!," May 31, 1985.

Maury Microwave Corporation, MT950 Series Transistor Test Fixture (TTF), Oct. 7, 1982, 4 pages.

Temptronic Corporation, "Model TPO3000 Series ThermoChuck Systems for Probing, Characterization and Failure analysis of Wafers, Chips and Hybrids at High and Low Temperatures," pp. 2-5.

Cascade Microtech, "Model 42/42D Microwave Probe Station Instruction Manual, Electrical Operation," pp. 4-1-4-42.

Inter-Continental Microwave, "Microwave Semiconductor Chip Measurements using the HP 8510B TRL-Calibration Technique," Application Note: 101.

Design Technique, "Microstrip Microwave Test Fixture," May 1986, 2 pages.

Photo: Micromanipulator Probe Station 1994.

Micromanipulator Sales and Services Inc., "Test Station Accessories," Copyright 1983, 1984, 1 page.

Keithley Instruments, Inc. "Low-Level Measurements for Effective Low Current, Low Voltage, and High Impedance Measurements," Revised Third Edition, Printed Jun. 1984.

Inter-Continental Microwave, 2370-B Walsh Avenue, Santa Clara, CA 95051, "Product Catalog,".

Hewlett Packard, "HP 4284A Precision LCR Meter Operation Manual (Including Option 001,002,006,201,202,301)," Third Edition, Dec. 1991, pp. 2-1, 6-9, 6-15.

Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.

Cascade Microtech Technical Brief, A Guide to Better Vector Network Analyzer Calibrations for Probe-Tip Measurements, Copyright 1994, 2 pages.

Temptronic, "Guarded" Chuck Sketch, Nov. 15, 1989.

Arthur Fraser, Reed Gleason, E.W. Strid, "GHz On-Silicon-Wafer Probing Calibration Methods," Cascade Microtech Inc. P.O. Box 1589, Beaverton, OR 97075-1589, pp. 5-8.

William Knauer, "Fixturing for Low-Current/Low-Voltage Parametric Testing," Evaluation Engineering, Nov. 1990, pp. 9-12.

J.D.Tompkins, "Evaluating High Speed AC Testers," IBM Technical Disclosure Bulletin, vol. 13, No. 7 Dec. 1970, p. 180.

Jim Fitzpatrick, "Error Models for Systems Measurement," Microwave Journal, May 1978, pp. 63-66.

Design Technique International, "Adjustable Test Fixture," Copyright 1988.

Ronald F. Bauer & Paul Penfield, Jr., "De-Embedding and Unterminating," IEEE Transactions on Microwave Theory and Techniques, vol. MTT-22, No. 3, Mar. 1974, pp. 282-288.

Cross Section—Signatone S-1240 Sketch, Advertised & Sold 1987-1988.

Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.

R.Y. Koyama & M. G. Buehler, "Semiconductor Measurement Technology: A Wafer Chuck for Use Between—196 and 350° C, " U.S. Department of Commerce, National Technical Information Service, PB-293 298, Issued Jan. 1979.

Ken Cole, "ThermoChuck Performance (Fax)," 2 pages, Mar. 10, 1995.

S. Beck & E. Tomann, "Chip Tester," IBM Technical Disclosure Bulletin, Jan. 1985.

Applied Precision, "Checkpoint," 2 pages, 8505 SE $68^{th}$ Street, Mercer Island, Washington 98040.

Saswata Basu & Reed Gleason, "A Membrane Quadrant Probe for R&D Applications," Cascade Microtech, Inc. 14255 SW Brigadoon Ct., Beaverton, OR 97005, 3 pages.

The Micromanipulator Company, Inc., "Model 8000 Test Station," 1988, 1 page.

The Micromanipulator Company, Inc. "Model 8000 Test Station," 1988, 1 page.

"Vacuum," Mechanical Operation, pp. 3-8-3-9.

The Micromanipulator Company, Inc., "Accessories: Hot and Hot/Cold Chucks, Integrated Dry environments, Triaxial chucks, Integrated Shielded and Dark environments, Probe Card Holders," p. 8.

Microwave Products, Microwave Journal, Sep. 1988, 1 p.

Cascade Microtech, "Advanced On-Wafer Device Characterization Using the Summit 10500," pp. 2-20, Feb. 2001.

Hewlett Packard, "HP 4142B Modular DC source/Monitor Practical Applications—High Speed DC Characterization of Semiconductor Devices from Sub pA to 1A," Nov. 1987, pp. 1-4.

Doug Rytting, "Appendix to an Analysis of Vector Measurement Accuracy Enhancement Techniques," pp. 1-42, Hewlett Packard.

Temptronic Corporation, "Application Note 1 Controlled Environment Enclosure for low temperature wafer probing in a moisture-free environment," 2 pages.

Cascade Microtech, Inc. vs. Micromanipulator Company, Inc., "Deposition of Harry F. Applebay," United States District Court for the District of Oregon, Lead Case No. 97-479-Al, May 1998.

Flexion Corporation, "Cryotest Station MP-3," *Cascade Microtech, Inc.* vs. *Micromanipulator Company, Inc.*, Applebay Exhibit 576, May 13, 1998, 68 pages.

Flexion Corporation, "Cryotest Station MP-3," *Cascade Microtech, Inc.* vs. *Micromanipulator Company, Inc.*, Applebay Exhibit 578, May 13, 1998, 1 page.

*Cascade Microtech, Inc.* vs. *Micromanipulator Company, Inc.*, Applebay Exhibit 572, May 13, 1998, 2 pages.

*Cascade Microtech, Inc.* vs. *Micromanipulator Company, Inc.*, Applebay Exhibits 581A, 581B, and 581C, May 13, 1998, 3 pages.

Flexion Corporation, "AP-1 Cryotest Station," Applebay Exhibit 582, May 13, 1998, 20 pages.

Flexion Corporation, "AP-1 Cryotest Station User Manual," Applebay Exhibit 583, May 13, 1998, 187 pages.

*Cascade Microtech, Inc.* vs. *Micromanipulator Company, Inc.*, Applebay Exhibits 577A, 577B, 577C, May 13, 1998, 3 pages.

*Cascade Microtech, Inc.* vs. *Micromanipulator Company, Inc.*, Applebay Exhibit 585, May 13, 1998, 7 pages.

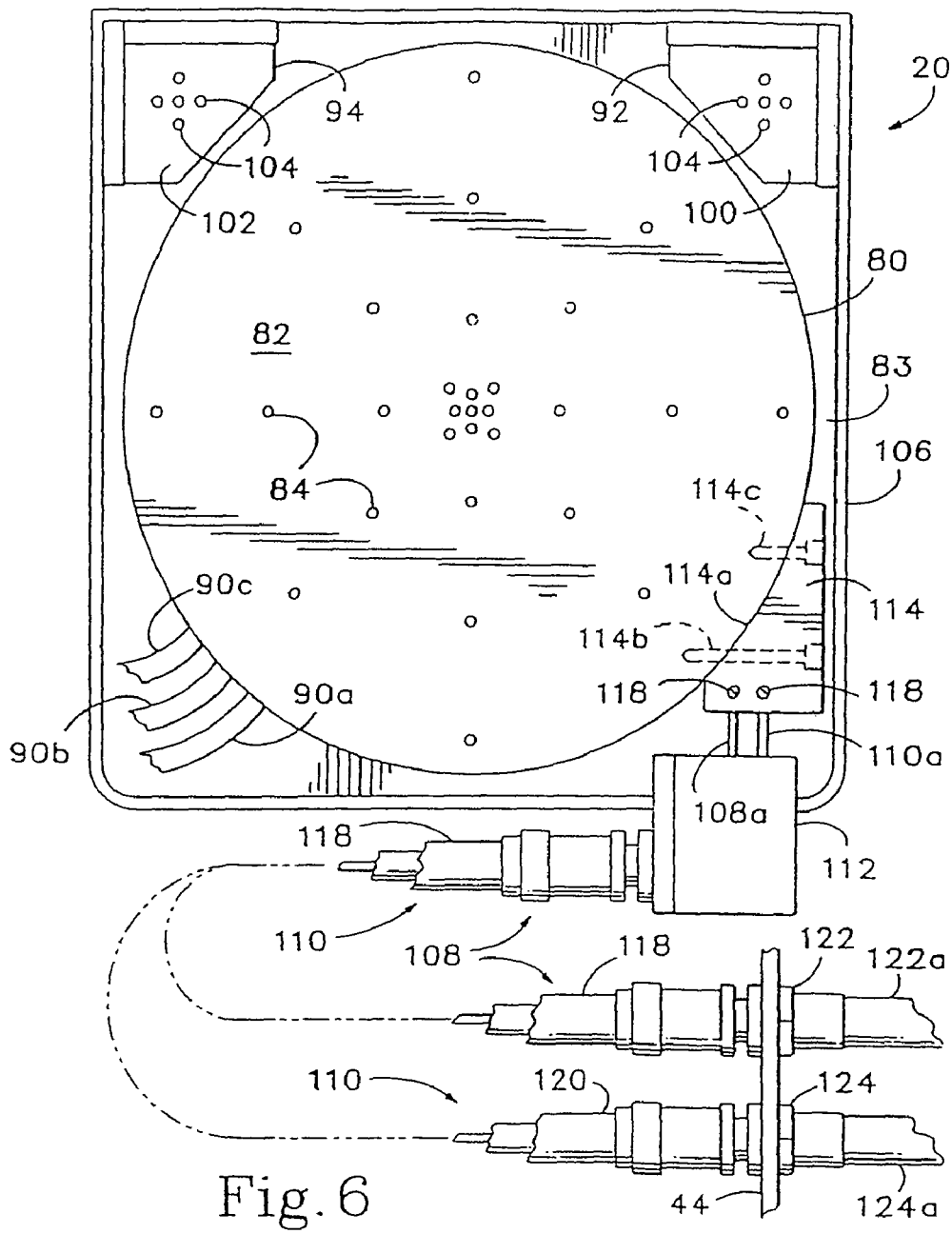
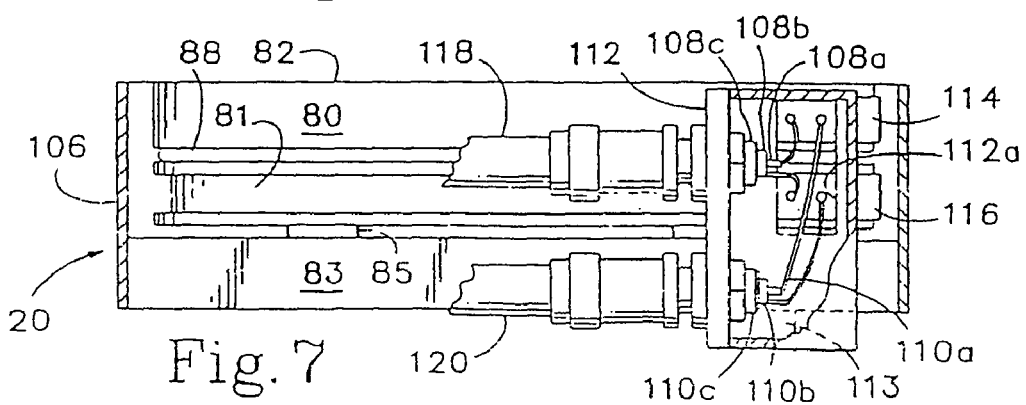
Fig. 6
Fig. 7

CHUCK FOR HOLDING A DEVICE UNDER TEST

CROSS-REFERENCE TO RELATED APPLICATIONS

This application is a division of U.S. patent application Ser. No. 11/204,910, filed Aug. 15, 2005, now U.S. Pat. No. 7,352,168; which is a continuation of U.S. patent application Ser. No. 09/877,823, filed Jun. 7, 2001, now U.S. Pat. No. 6,965,226, which claims the benefit of U.S. Provisional App. No. 60/230,212, filed Sep. 5, 2000.

BACKGROUND OF THE INVENTION

The present application relates to an improved chuck.

With reference to FIGS. 1, 2 and 3, a probe station comprises a base 10 (shown partially) which supports a platen 12 through a number of jacks 14a, 14b, 14c, 14d which selectively raise and lower the platen vertically relative to the base by a small increment (approximately one-tenth of an inch) for purposes to be described hereafter. Also supported by the base 10 of the probe station is a motorized positioner 16 having a rectangular plunger 18 which supports a movable chuck assembly 20 for supporting a wafer or other test device. The chuck assembly 20 passes freely through a large aperture 22 in the platen 12 which permits the chuck assembly to be moved independently of the platen by the positioner 16 along X, Y and Z axes, i.e., horizontally along two mutually-perpendicular axes X and Y, and vertically along the Z axis. Likewise, the platen 12, when moved vertically by the jacks 14, moves independently of the chuck assembly 20 and the positioner 16.

Mounted atop the platen 12 are multiple individual probe positioners such as 24 (only one of which is shown), each having an extending member 26 to which is mounted a probe holder 28 which in turn supports a respective probe 30 for contacting wafers and other test devices mounted atop the chuck assembly 20. The probe positioner 24 has micrometer adjustments 34, 36 and 38 for adjusting the position of the probe holder 28, and thus the probe 30, along the X, Y and Z axes, respectively, relative to the chuck assembly 20. The Z axis is exemplary of what is referred to herein loosely as the "axis of approach" between the probe holder 28 and the chuck assembly 20, although directions of approach which are neither vertical nor linear, along which the probe tip and wafer or other test device are brought into contact with each other, are also intended to be included within the meaning of the term "axis of approach." A further micrometer adjustment 40 adjustably tilts the probe holder 28 to adjust planarity of the probe with respect to the wafer or other test device supported by the chuck assembly 20. As many as twelve individual probe positioners 24, each supporting a respective probe, may be arranged on the platen 12 around the chuck assembly 20 so as to converge radially toward the chuck assembly similarly to the spokes of a wheel. With such an arrangement, each individual positioner 24 can independently adjust its respective probe in the X, Y and Z directions, while the jacks 14 can be actuated to raise or lower the platen 12 and thus all of the positioners 24 and their respective probes in unison.

An environment control enclosure is composed of an upper box portion 42 rigidly attached to the platen 12, and a lower box portion 44 rigidly attached to the base 10. Both portions are made of steel or other suitable electrically conductive material to provide EMI shielding. To accommodate the small vertical movement between the two box portions 42 and 44 when the jacks 14 are actuated to raise or lower the platen 12, an electrically conductive resilient foam gasket 46, preferably composed of silver or carbon-impregnated silicone, is interposed peripherally at their mating juncture at the front of the enclosure and between the lower portion 44 and the platen 12 so that an EMI, substantially hermetic, and light seal are all maintained despite relative vertical movement between the two box portions 42 and 44. Even though the upper box portion 42 is rigidly attached to the platen 12, a similar gasket 47 is preferably interposed between the portion 42 and the top of the platen to maximize sealing.

With reference to FIGS. 5A and 5B, the top of the upper box portion 42 comprises an octagonal steel box 48 having eight side panels such as 49a and 49b through which the extending members 26 of the respective probe positioners 24 can penetrate movably. Each panel comprises a hollow housing in which a respective sheet 50 of resilient foam, which may be similar to the above-identified gasket material, is placed. Slits such as 52 are partially cut vertically in the foam in alignment with slots 54 formed in the inner and outer surfaces of each panel housing, through which a respective extending member 26 of a respective probe positioner 24 can pass movably. The slitted foam permits X, Y and Z movement of the extending members 26 of each probe positioner, while maintaining the EMI, substantially hermetic, and light seal provided by the enclosure. In four of the panels, to enable a greater range of X and Y movement, the foam sheet 50 is sandwiched between a pair of steel plates 55 having slots 54 therein, such plates being slidable transversely within the panel housing through a range of movement encompassed by larger slots 56 in the inner and outer surfaces of the panel housing.

Atop the octagonal box 48, a circular viewing aperture 58 is provided, having a recessed circular transparent sealing window 60 therein. A bracket 62 holds an apertured sliding shutter 64 to selectively permit or prevent the passage of light through the window. A stereoscope (not shown) connected to a CRT monitor can be placed above the window to provide a magnified display of the wafer or other test device and the probe tip for proper probe placement during set-up or operation. Alternatively, the window 60 can be removed and a microscope lens (not shown) surrounded by a foam gasket can be inserted through the viewing aperture 58 with the foam providing EMI, hermetic and light sealing. The upper box portion 42 of the environment control enclosure also includes a hinged steel door 68 which pivots outwardly about the pivot axis of a hinge 70 as shown in FIG. 2A. The hinge biases the door downwardly toward the top of the upper box portion 42 so that it forms a tight, overlapping, sliding peripheral seal 68a with the top of the upper box portion. When the door is open, and the chuck assembly 20 is moved by the positioner 16 beneath the door opening as shown in FIG. 2A, the chuck assembly is accessible for loading and unloading.

With reference to FIGS. 3 and 4, the sealing integrity of the enclosure is likewise maintained throughout positioning movements by the motorized positioner 16 due to the provision of a series of four sealing plates 72, 74, 76 and 78 stacked slidably atop one another. The sizes of the plates progress increasingly from the top to the bottom one, as do the respective sizes of the central apertures 72a, 74a, 76a and 78a formed in the respective plates 72, 74, 76 and 78, and the aperture 79a formed in the bottom 44a of the lower box portion 44. The central aperture 72a in the top plate 72 mates closely around the bearing housing 18a of the vertically-movable plunger 18. The next plate in the downward progression, plate 74, has an upwardly-projecting peripheral margin 74b which limits the extent to which the plate 72 can slide across the top of the plate 74. The central aperture 74a in the plate 74 is of a size to permit the positioner 16 to move the plunger 18 and its bearing housing 18 a transversely along the X and Y axes until the edge of the top plate 72 abuts against the margin 74b of the plate 74. The size of the aperture 74a is, however, too small to be uncovered by the top plate 72 when such abutment occurs, and therefore a seal is maintained between the plates 72 and 74 regardless of the movement of the plunger 18 and its bearing housing along the X and Y axes. Further movement of the plunger 18 and bearing housing in the direction of abutment of the plate 72 with the margin 74b results in the sliding of the plate 74 toward the peripheral margin 76b of the next underlying plate 76. Again, the central aperture 76a in the plate 76 is large enough to permit abutment of the plate 74 with the margin 76b, but small enough to prevent the plate 74 from uncovering the aperture 76a, thereby likewise maintaining the seal between the plates 74 and 76. Still further movement of the plunger 18 and bearing housing in the same direction causes similar sliding of the plates 76 and 78 relative to their underlying plates into abutment with the margin 78b and the side of the box portion 44, respectively, without the apertures 78a and 79a becoming uncovered. This combination of sliding plates and central apertures of progressively increasing size permits a full range of movement of the plunger 18 along the X and Y axes by the positioner 16, while maintaining the enclosure in a sealed condition despite such positioning movement. The EMI sealing provided by this structure is effective even with respect to the electric motors of the positioner 16, since they are located below the sliding plates.

With particular reference to FIGS. 3, 6 and 7, the chuck assembly 20 is a modular construction usable either with or without an environment control enclosure. The plunger 18 supports an adjustment plate 79 which in turn supports first, second and third chuck assembly elements 80, 81 and 83, respectively, positioned at progressively greater distances from the probe(s) along the axis of approach. Element 83 is a conductive rectangular stage or shield 83 which detachably mounts conductive elements 80 and 81 of circular shape. The element 80 has a planar upwardly-facing wafer-supporting surface 82 having an array of vertical apertures 84 therein. These apertures communicate with respective chambers separated by O-rings 88, the chambers in turn being connected separately to different vacuum lines 90a, 90b, 90c (FIG. 6) communicating through separately-controlled vacuum valves (not shown) with a source of vacuum. The respective vacuum lines selectively connect the respective chambers and their apertures to the source of vacuum to hold the wafer, or alternatively isolate the apertures from the source of vacuum to release the wafer, in a conventional manner. The separate operability of the respective chambers and their corresponding apertures enables the chuck to hold wafers of different diameters.

In addition to the circular elements 80 and 81, auxiliary chucks such as 92 and 94 are detachably mounted on the corners of the element 83 by screws (not shown) independently of the elements 80 and 81 for the purpose of supporting contact substrates and calibration substrates while a wafer or other test device is simultaneously supported by the element 80. Each auxiliary chuck 92, 94 has its own separate upwardly-facing planar surface 100, 102 respectively, in parallel relationship to the surface 82 of the element 80. Vacuum apertures 104 protrude through the surfaces 100 and 102 from communication with respective chambers within the body of each auxiliary chuck. Each of these chambers in turn communicates through a separate vacuum line and a separate independently-actuated vacuum valve (not shown) with a source of vacuum, each such valve selectively connecting or isolating the respective sets of apertures 104 with respect to the source of vacuum independently of the operation of the apertures 84 of the element 80, so as to selectively hold or release a contact substrate or calibration substrate located on the respective surfaces 100 and 102 independently of the wafer or other test device. An optional metal shield 106 may protrude upwardly from the edges of the element 83 to surround the other elements 80, 81 and the auxiliary chucks 92, 94.

All of the chuck assembly elements 80, 81 and 83, as well as the additional chuck assembly element 79, are electrically insulated from one another even though they are constructed of electrically conductive metal and interconnected detachably by metallic screws such as 96. With reference to FIGS. 3 and 3A, the electrical insulation results from the fact that, in addition to the resilient dielectric O-rings 88, dielectric spacers 85 and dielectric washers 86 are provided. These, coupled with the fact that the screws 96 pass through oversized apertures in the lower one of the two elements which each screw joins together thereby preventing electrical contact between the shank of the screw and the lower element, provide the desired insulation. As is apparent in FIG. 3, the dielectric spacers 85 extend over only minor portions of the opposing surface areas of the interconnected chuck assembly elements, thereby leaving air gaps between the opposing surfaces over major portions of their respective areas. Such air gaps minimize the dielectric constant in the spaces between the respective chuck assembly elements, thereby correspondingly minimizing the capacitance between them and the ability for electrical current to leak from one element to another. Preferably the spacers and washers 85 and 86, respectively, are constructed of a material having the lowest possible dielectric constant consistent with high dimensional stability and high volume resistivity. A suitable material for the spacers and washers is glass epoxy, or acetyl homopolymer marketed under the trademark Delrin by E. I. DuPont.

With reference to FIGS. 6 and 7, the chuck assembly 20 also includes a pair of detachable electrical connector assemblies designated generally as 108 and 110, each having at least two conductive connector elements 108a, 108b and 110a, 110b, respectively, electrically insulated from each other, with the connector elements 108b and 110b preferably coaxially surrounding the connector elements 108a and 110a as guards therefor. If desired, the connector assemblies 108 and 110 can be triaxial in configuration so gas to include respective outer shields 108c, 110c surrounding the respective connector elements 108b and 110b, as shown in FIG. 7. The outer shields 108c and 110c may, if desired, be connected electrically through a shielding box 112 and a connector supporting bracket 113 to the chuck assembly element 83, although such electrical connection is optional particularly in view of the surrounding EMI shielding enclosure 42, 44. In any case, the respective connector elements 108a and 110a are electrically connected in parallel to a connector plate 114 matingly and detachably connected along a curved contact surface 114a by screws 114b and 114c to the curved edge of the chuck assembly element 80. Conversely, the connector elements 108b and 110b are connected in parallel to a connector plate 116 similarly matingly connected detachably to element 81. The connector elements pass freely through a rectangular opening 112a in the box 112, being electrically insulated from the box 112 and therefore from the element 83, as well as being electrically insulated from each other. Set screws such as 118 detachably fasten the connector elements to the respective connector plates 114 and 116.

Either coaxial or, as shown, triaxial cables 118 and 120 form portions of the respective detachable electrical connector assemblies 108 and 110, as do their respective triaxial detachable connectors 122 and 124 which penetrate a wall of the lower portion 44 of the environment control enclosure so that the outer shields of the triaxial connectors 122, 124 are electrically connected to the enclosure. Further triaxial cables 122a, 124a are detachably connectable to the connectors 122 and 124 from suitable test equipment such as a Hewlett-Packard 4142B modular DC source/monitor or a Hewlett-Packard 4284A precision LCR meter, depending upon the test application. If the cables 118 and 120 are merely coaxial cables or other types of cables having only two conductors, one conductor interconnects the inner (signal) connector element of a respective connector 122 or 124 with a respective connector element 108a or 110a, while the other conductor connects the intermediate (guard) connector element of a respective connector 122 or 124 with a respective connector element 108b, 110b. U.S. Pat. No. 5,532,609 discloses a probe station and chuck and is hereby incorporated by reference.

The chuck assembly 20 with corresponding vertical apertures 84 and respective chambers separated by O-rings 88 permits selectively creating a vacuum within three different zones. Including the three O-rings 88 and the dielectric spacers 85 surrounding the metallic screws 96 permits securing adjacent first, second and third chuck assembly elements 80, 81 and 83 together. The concentric O-rings 88 are squeezed by the first and second chuck assembly elements and assist in distributing the force across the upper surface of the chuck assembly 20 to maintain a flat surface. However, the O-rings and dielectric spacers 85 have a greater dielectric constant than the surrounding air resulting in leakage currents. Also, the additional material between adjoining chuck assembly elements 80, 81, and 83 decreases the capacitance between the adjoining chuck assembly elements. Moreover, the dielectric material of the O-rings and dielectric spacers 85 builds up a charge therein during testing which increases the dielectric absorption. The O-rings and dielectric spacers 85 provides mechanical stability against warping the chuck when a wafer thereon is probed so that thinner chuck assembly elements 80, 81, and 83 may be used. The height of the different O-rings and dielectric spacers 85 tend to be slightly different which introduces non-planarity in the upper surface when the first, second, and third chuck assembly elements 80, 81, and 83 are secured together.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 2A is a partial top view of the wafer probe station of FIG. 1 with the enclosure door shown partially open.

FIG. 3A is an enlarged sectional view taken along line 3A-3A of FIG. 3.

FIG. 6 is a partially schematic top detail view of the chuck assembly, taken along line 6-6 of FIG. 3.

FIG. 7 is a partially sectional front view of the chuck assembly of FIG. 6.

DETAILED DESCRIPTION OF PREFERRED EMBODIMENT

Traditionally chuck designers use thin chuck assembly elements and many radially arranged screws in order to permit the screws to be tightened tightly without significantly warping any of the chuck assembly elements, and in particular the upper chuck assembly element. Maintaining a flat planar upper chuck assembly element is important to permit accurate probing of the wafer and avoid breaking, or otherwise damaging, the wafer while probing. In a multi-layered chuck, the lower chuck assembly element is secured to the middle chuck assembly element, the middle chuck assembly element in turn is secured to the upper chuck assembly element, which results in any non-uniformities of slightly different thicknesses of the chuck assembly elements and interposed dielectric elements creating a cumulative non-planarity. For example, non-uniformity in the planarity of the lower chuck assembly element and differences in the thickness of the dielectric spacers may result in the middle chuck assembly element being slightly warped when secured thereto. Non-uniformity in the planarity of the middle chuck assembly element, the slight warping of the middle chuck assembly element, and the differences in the thickness of the dielectric spacers and O-rings, may result significant warping of the upper chuck assembly element when secured to the middle chuck assembly element. Accordingly, the thicknesses and planarity of (1) each chuck assembly element, (2) dielectric spacers, and (3) O-rings, needs to be accurately controlled in order to achieve a planar upper surface of the upper chuck assembly element.

Figure 1:
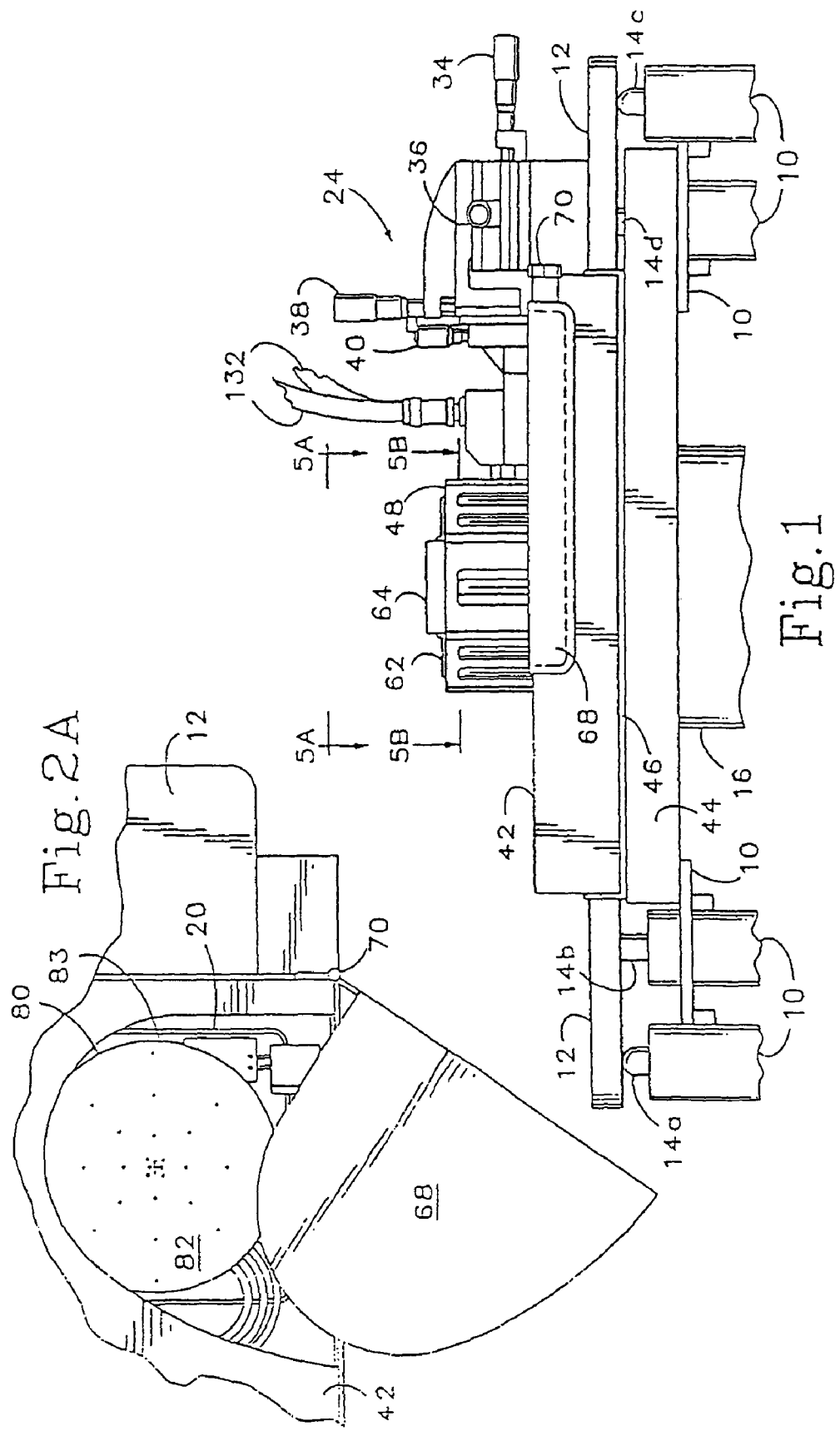
FIG. 1 is a partial front view of an exemplary embodiment of a wafer probe station constructed in accordance with the present invention.
Figure 2:
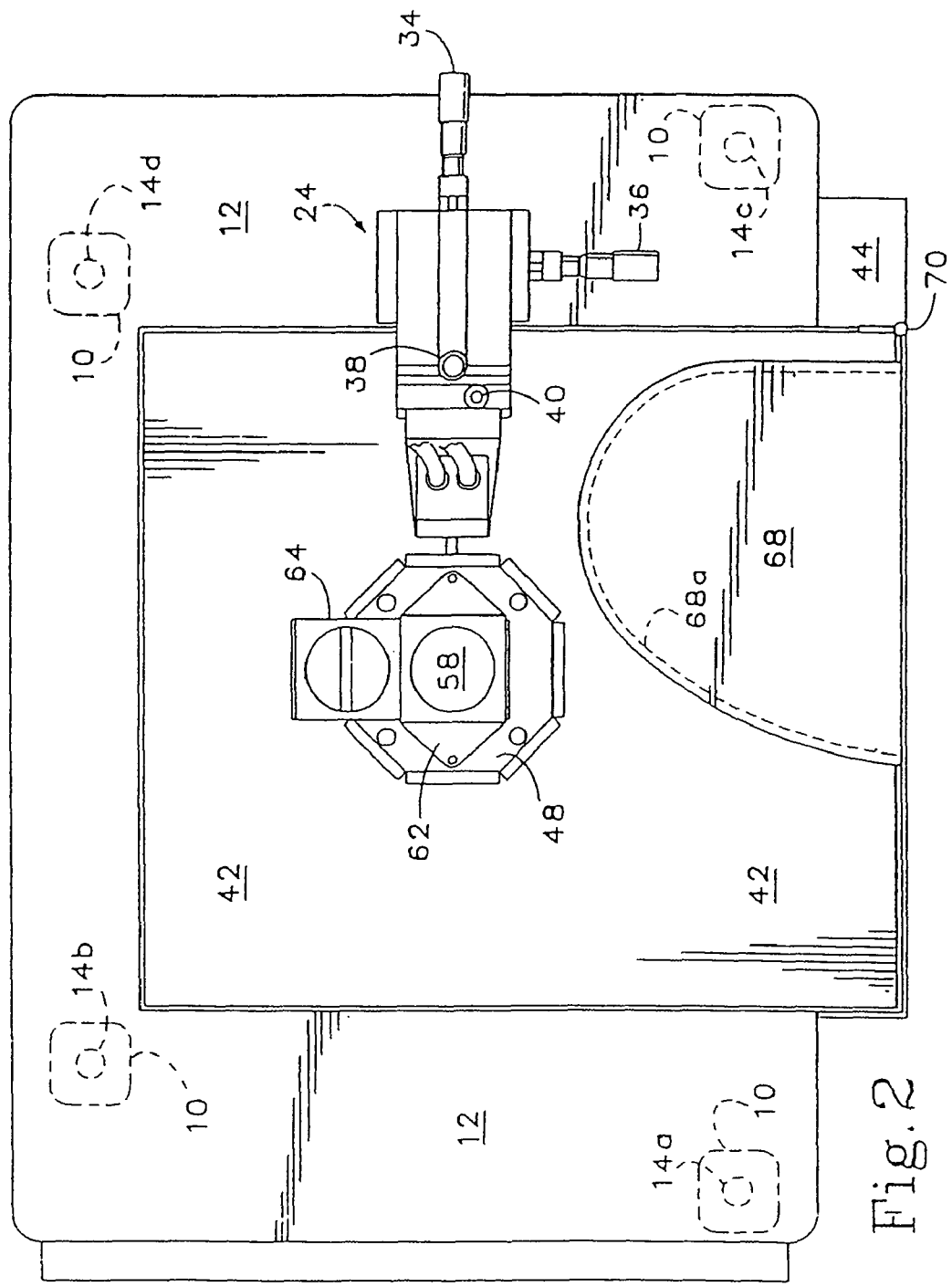
FIG. 2 is a top view of the wafer probe station of FIG. 1.
Figure 3:
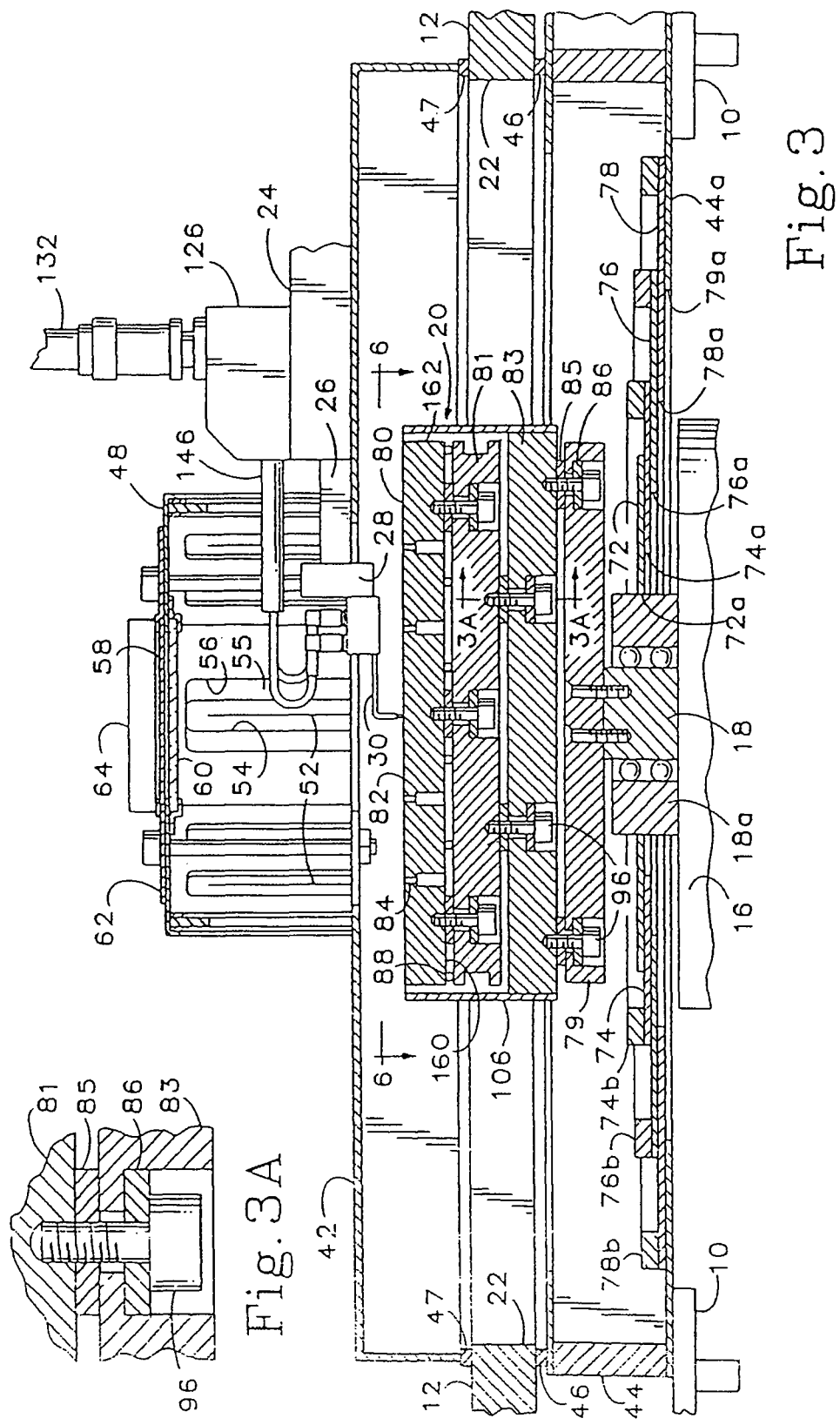
FIG. 3 is a partially sectional and partially schematic front view of the probe station of FIG. 1.
Figure 4:
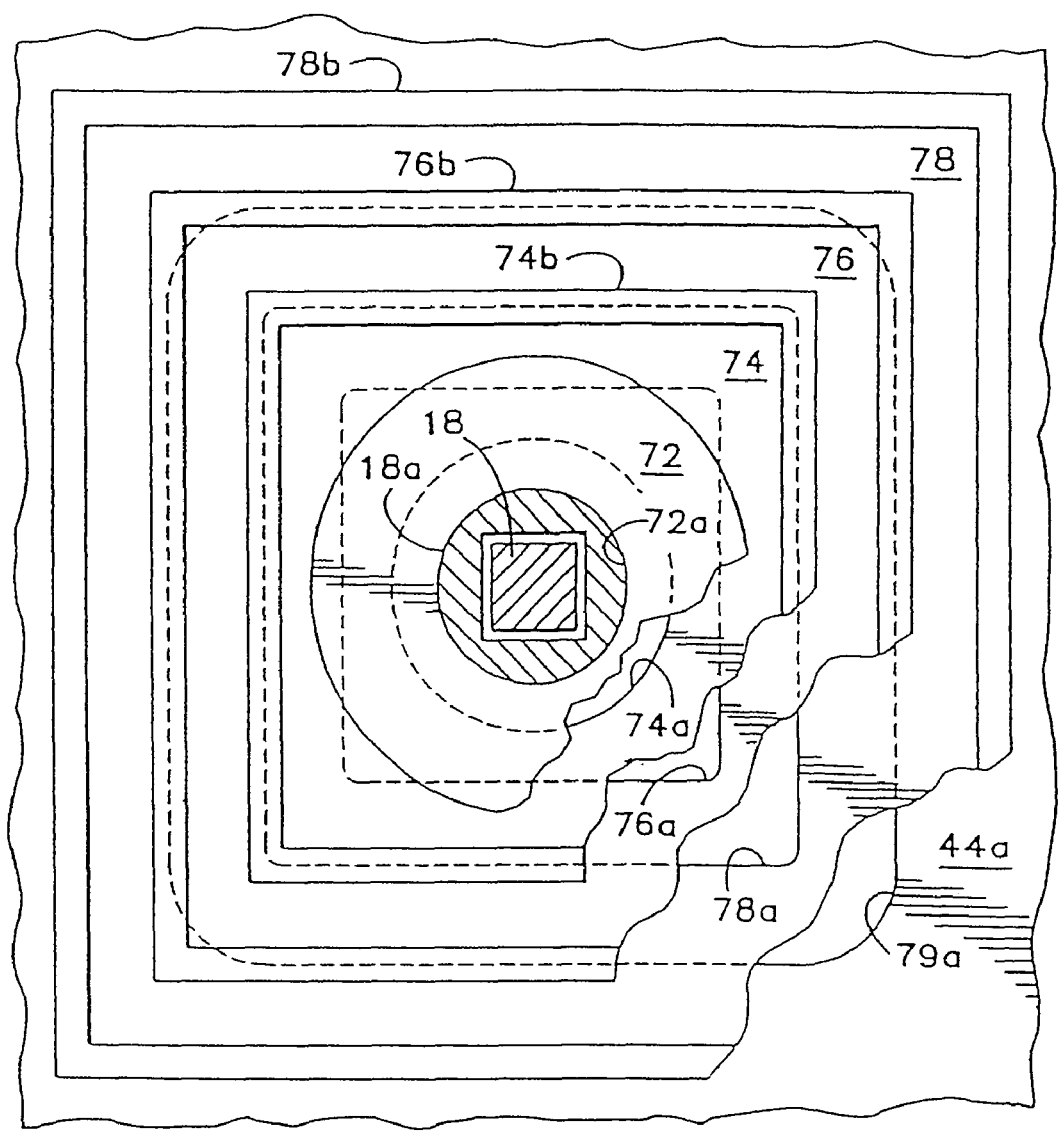
FIG. 4 is a top view of the sealing assembly where the motorized positioning mechanism extends through the bottom of the enclosure.
Figure 5A:
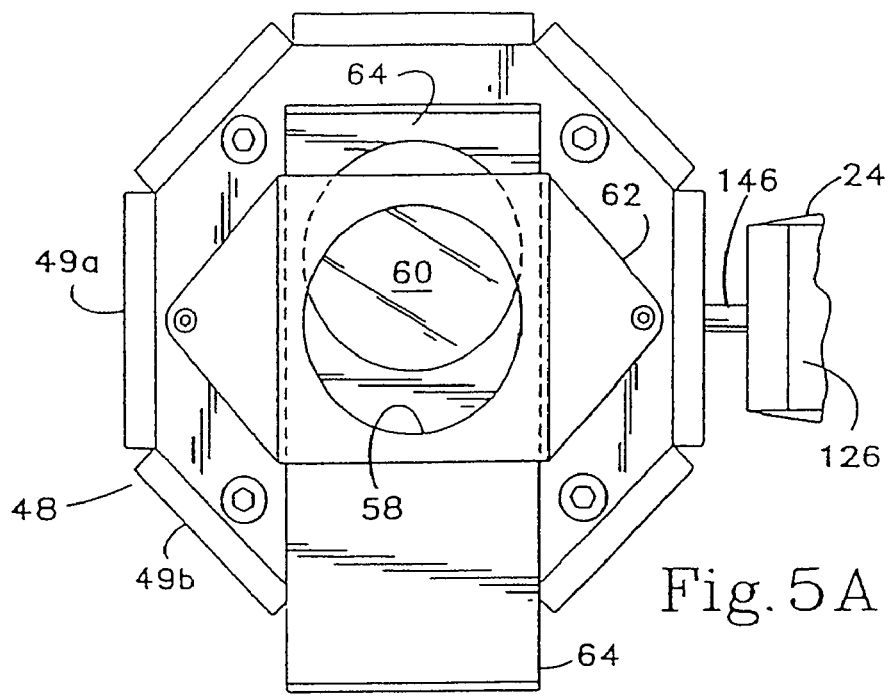
FIG. 5A is an enlarged top detail view taken along line 5A-5A of FIG. 1.
Figure 5B:
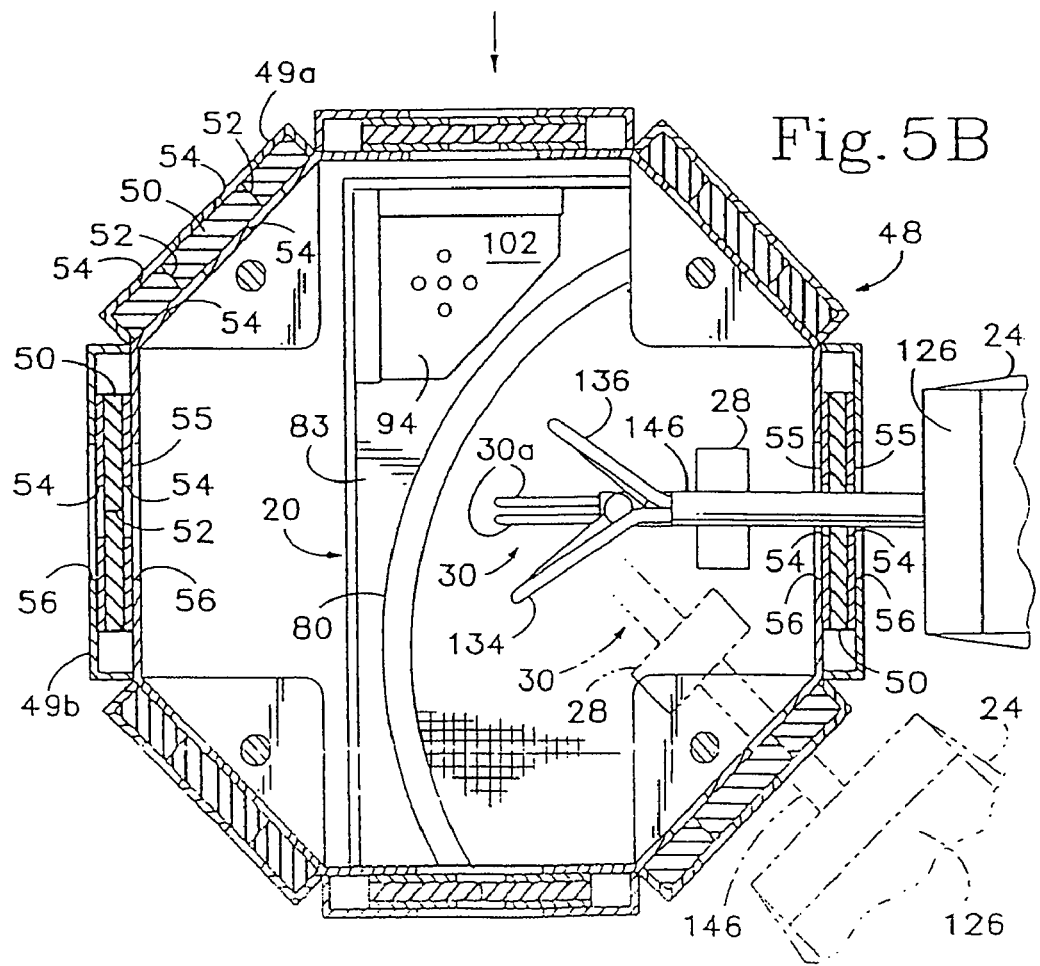
FIG. 5B is an enlarged top sectional view taken along line 5B-5B of FIG. 1.
Figure 8:
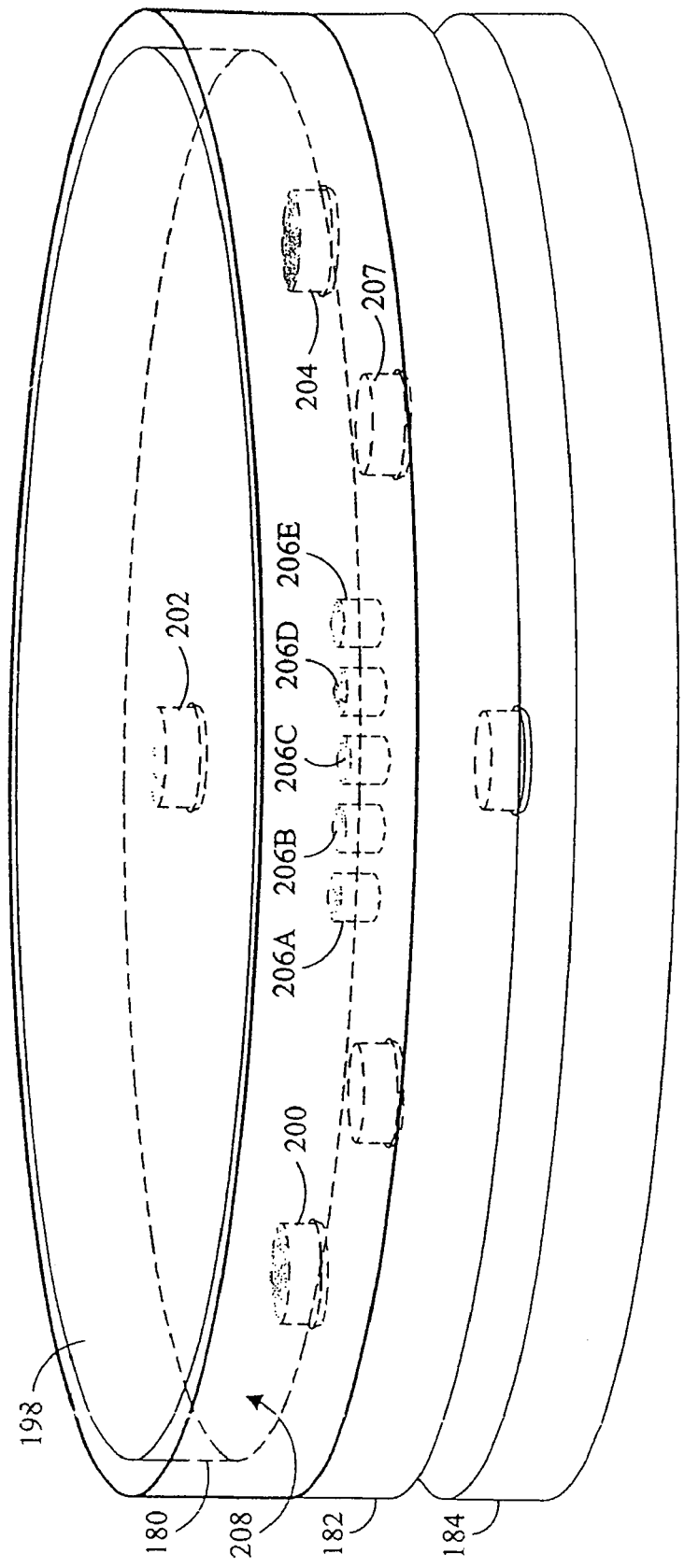
FIG. 8 is a perspective view of a chuck illustrating a set of spacers and vacuum interconnections.

After consideration of the thin chuck assembly elements and the desire to minimize warping of the upper chuck assembly element, the present inventor came to the realization that a three point securement system, including for example three pins, permits defining the orientation of the upper chuck assembly element without inducing stress into the upper chuck assembly element 180, as illustrated in FIG. 8. Preferably, the pins are substantially equal distant from one another. Changes in the spacing of the height of any of the pins 200, 202, 204 results in pivoting the upper chuck assembly element 180 about the remaining two pins in a manner free from introducing added stress and hence non-planarity of the upper surface 198 of the upper chuck assembly element. There are preferably no dielectric spacers which maintain, or otherwise define, the spacing between the upper and middle chuck assembly elements, other than the pins 200, 202, 204. The elimination of dielectric spacers, such as O-rings, avoids stressing the upper chuck assembly element when under pressing engagement with the middle chuck assembly element. Another benefit that may be achieved by using a three point system is that the orientation of the upper surface of the upper chuck assembly element may be defined with respect to the prober stage and probes with minimal, if any, planarization of the intervening layers. In other words, if the planarity of the middle and lower chuck assembly elements is not accurately controlled, the planarity of the upper chuck assembly element will not be affected. Normally the spacing between the upper/middle and middle/lower chuck assembly elements is relatively uniform to provide relatively uniform capacitance between the respective chuck assembly elements. It is to be understood that any suitable interconnection assembly involving three discrete points or regions of the chuck assembly elements may be employed.

Minimization of the spacers, such as O-rings, between the upper and middle chuck assembly elements reduces the capacitive coupling between the upper and middle chuck assembly elements to less than it would have been with additional dielectric layer material there between. The elimination of additional spacers likewise increases the resistance between adjacent chuck assembly elements.

Connecting each vacuum line(s) directly to the center of the upper chuck assembly element 180 normally requires at least one corresponding hole drilled radially into the upper chuck assembly element from which vertically extending vacuum chambers provide a vacuum to the upper surface 198 of the upper chuck assembly element. Machining the combination of radial and vertical holes requires highly accurate machining which is difficult, time consuming, and expensive. Machining such holes becomes increasingly more difficult as the size of the chucks increases.

Figure 9:
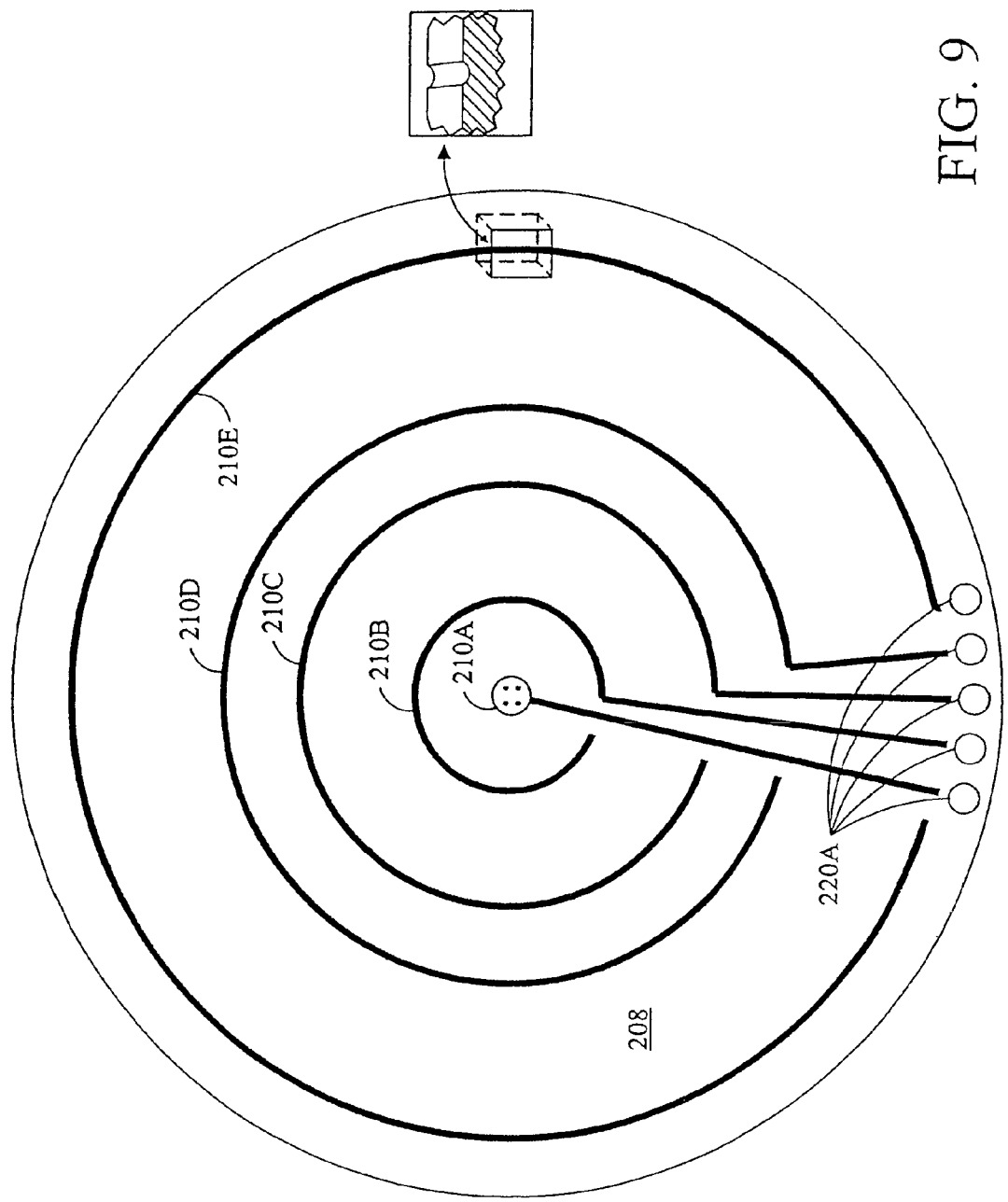
FIG. 9 is a plan view of the bottom surface of the upper chuck assembly element.
Figure 10:
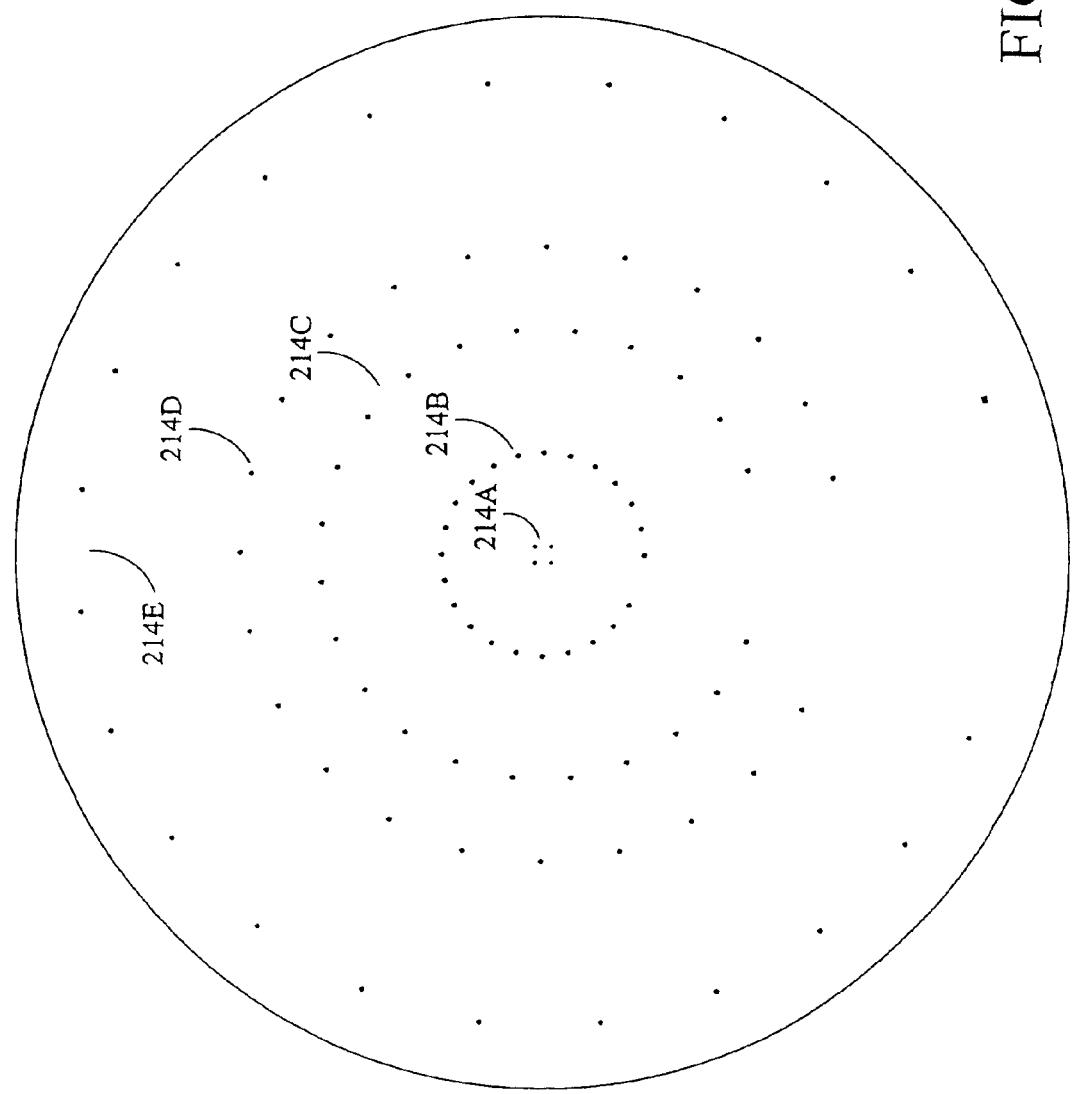
FIG. 10 is a plan view of the upper surface of the upper chuck assembly element.

After consideration of the difficulty of machining accurate holes into the side of the upper chuck assembly element 180, the present inventor determined that machining a set of airways 210a-210e in the lower surface 208 of the upper chuck assembly element is easier and tends to be more accurate, as shown in FIG. 9. In addition, the airways 210a-210e in the lower surface 208 of the chuck may be readily cleaned of dust and debris. The lower surface 208 of the upper chuck assembly element is covered with a cover plate 212 (see FIG. 11), which is preferably thin. The cover plate 212 is preferably secured to the upper chuck assembly with glue (not shown) and a thin layer of vacuum grease to provide a seal there between. Preferably, the cover plate 212 is conductive material electrically connected to the upper chuck assembly element. It is to be understood that the cover plate may be made of any material having any thickness, as desired. Referring to FIG. 10, a plurality of "zones" defined by vacuum holes 214a-214e to the upper surface 198 may be achieved, each of which is preferably concentric in nature, so that each "zone" may be individually controlled and provided a vacuum, if desired. This provides accurate pressure control for different sizes of wafers. For example, the diameters of the concentric rings may be, 2½", 5½", 7½", and 11½" to accommodate wafers having sizes of 3", 6", 8", and 12". This permits the system to be selectively controlled to accommodate the size of the wafer being tested so that uncovered vacuum holes are not attempting to provide a vacuum, which may reduce the vacuum pressure available and pull contaminated air through the system. Dust and other debris in contaminated air may result in a thin layer of dust within the vacuum interconnections, described later, resulting in a decrease in electrical isolation between the upper and middle chuck assembly elements. It is to be understood that any suitable structure may be used to define a series of airways between adjacent layers of material, such materials preferably being conductive and in face-to-face engagement. The definition of airways may even be used with chucks where the vacuum lines are interconnected to the upper chuck assembly element, together with the definition of airway.

The elimination of the O-rings between the adjacent upper and middle chuck assembly elements creates a dilemma as to of how to provide a vacuum to the top surface of the upper chuck assembly element, if desired. The present inventor determined that it is normally undesirable to attach a vacuum tube directly to the upper chuck assembly element because the exterior conductive surface of the vacuum tube is normally connected to shield potential. The shield potential of the exterior of the vacuum tube directly adjoining the upper chuck assembly element would result in an unguarded leakage current between the upper chuck assembly and the vacuum tube.

Figure 11:
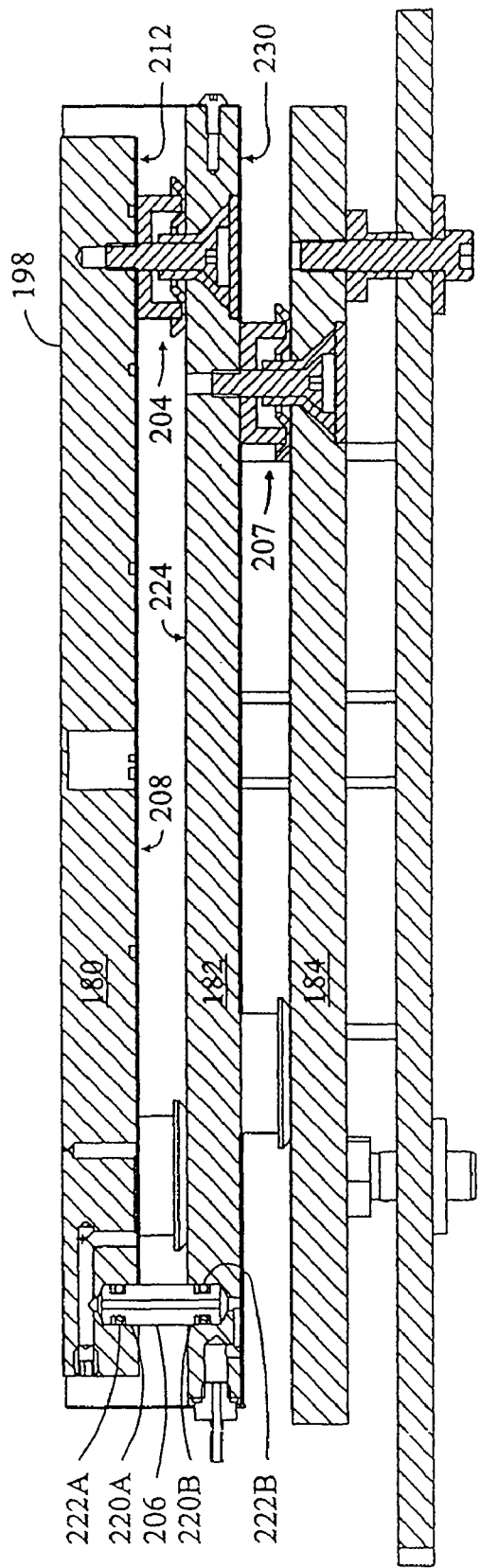
FIG. 11 is a cross sectional view of a multi-layer chuck.

To provide a vacuum path between the middle chuck assembly element and the upper chuck assembly element a vacuum pin 206 interconnects respective vacuum lines and particular vacuum holes (e.g., "zones") on the upper surface of the upper chuck assembly element, as illustrated in FIG. 11. Normally, one vacuum line and one vacuum pin is provided for each "zone." The vacuum pins are preferably recessed into respective openings 220a and 220b in the facing surfaces 208 and 224 of the upper and middle chuck assembly elements. Each vacuum pin includes a pair of O-rings 222a and 222b which provides a seal within respective openings 220a and 220b and likewise permits the vacuum pins 206 to move within the openings. The spacing between the facing surfaces 208 and 224, depth of the openings 220a and 220b, and length of the vacuum pins 206 are preferably selected such that changes in the spacing between the surfaces still permit the vacuum pins 206 some movement within the openings 220a and 220b. Accordingly, the vacuum pins "float" within the openings and do not determine, or otherwise limit, the spacing between the upper and middle chuck assembly elements. Further, the vacuum pins are not rigidly connected to both the upper and middle chuck assembly elements. Alternatively, the vacuum pins may be rigidly connected to one of the upper and middle chuck assembly elements, if desired. The vacuum pins are preferably constructed from a good dielectric material, such as Teflon or PCTFE. Preferably, the vacuum pin(s) are positioned at locations exterior to the pins 200, 201, 204 (e.g., the distance from the center of the chuck to the pins is less than the distance from the center of the chuck to the vacuum pins) to minimize noise. It is to be understood that any non-rigidly interconnected set (one or more) of vacuum paths that do not define the spacing may be provided between a pair of chuck assembly elements.

The pin securing the middle chuck assembly element 182 to the upper chuck assembly element 180 includes a portion thereunder that is open to the lower chuck assembly element, normally connected to shield. More specifically, the pin 204 electrically connected to the upper chuck assembly element 180 provides an unguarded leakage path through the middle chuck assembly element 182 to the lower chuck assembly element 184. In existing designs, a small plate is secured over the opening to provide guarding. A more convenient guarding structure is a lower cover plate 230 over the pin openings, preferably covering a major portion of the middle chuck assembly element 182. The lower cover plate 230 is electrically isolated from the pins. In addition, the plate 230 together with the middle chuck assembly element 182 defines vacuum paths.

Figure 12:
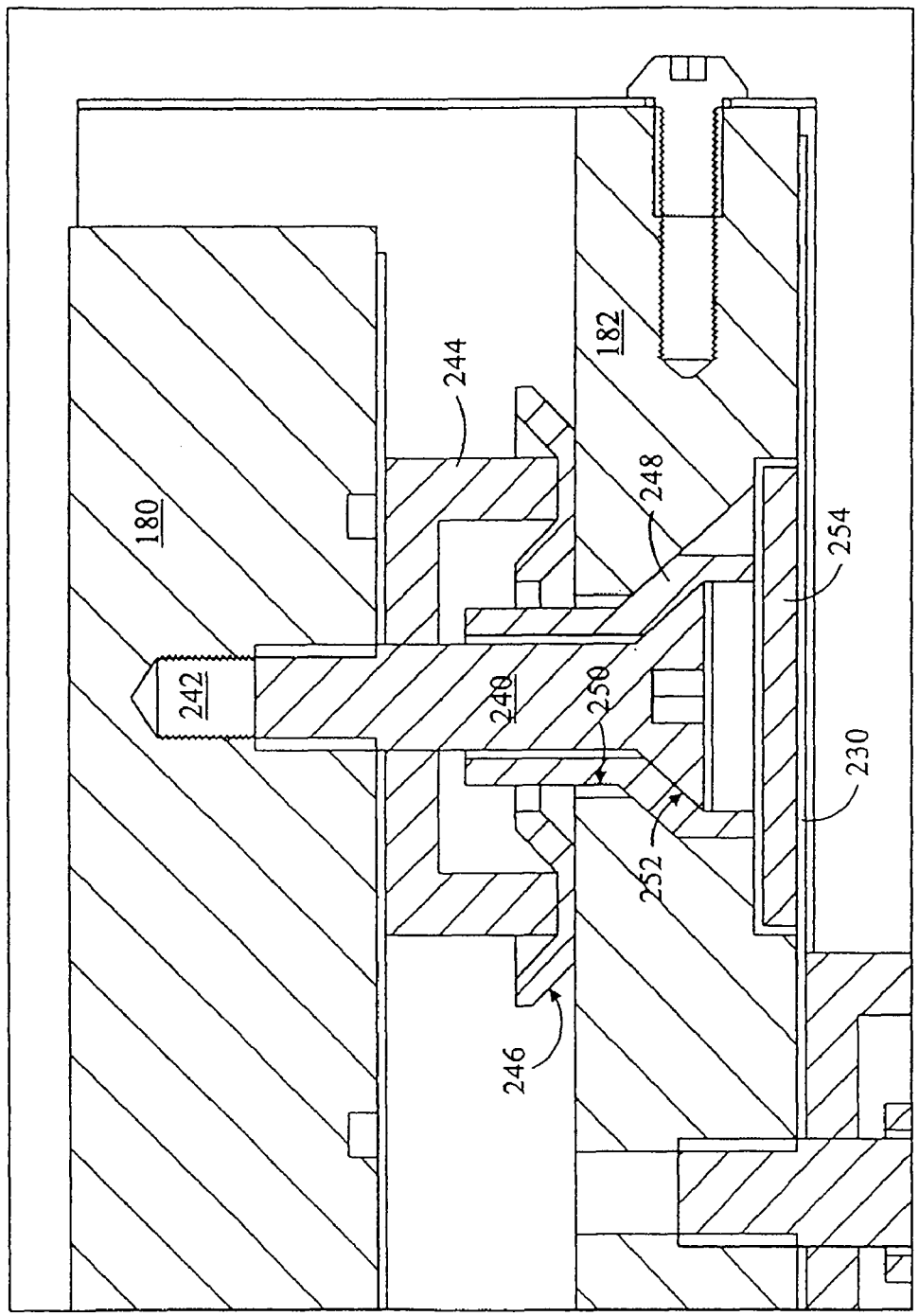
FIG. 12 is an enlarged cross sectional view of the interconnection between a pair of chuck assembly elements of the chuck of FIG. 11.

Referring to FIG. 12, the pin structure provides both mechanical stability and electrical isolation. A threaded screw 240 is inserted through the middle chuck assembly element 182 and threaded into a threaded opening 242 in the lower surface of the upper chuck assembly element 180. A conductive circular generally U-shaped member 244 separates the upper and middle chuck assembly elements and is in pressing engagement with the upper chuck assembly element. The conductive U-shaped member 244 is electrically connected to the screw 240 and extends radially outward from the screw 240. The conductive U-shaped member provides lateral stability of the chuck assembly. An insulating circular generally U-shaped member 246, preferably made from PCTFE, opposes the conductive U-shaped member 244 and is in pressing engagement with the middle chuck assembly element. The insulating circular U-shaped member 246 self-centers to the conductive U-shaped member 244 within the upwardly extending portions thereof. A circular insulating insert 248 surrounds the threaded screw 240 within the opening 250 in the middle chuck assembly element and supports the inclined head portion 252 of the threaded screw 240. In the case that the screw 240 does not have an inclined portion the insulating insert may support the head portion of the screw 240. An insulating cover 254 is preferably placed over the end of the threaded screw 240 and preferably spaced apart therefrom. Over the end of the screw is the cover plate 230, preferably connected to a guard potential. The pin structure may likewise be used, if desired, between other adjacent plates of the chuck assembly.

Figure 13:
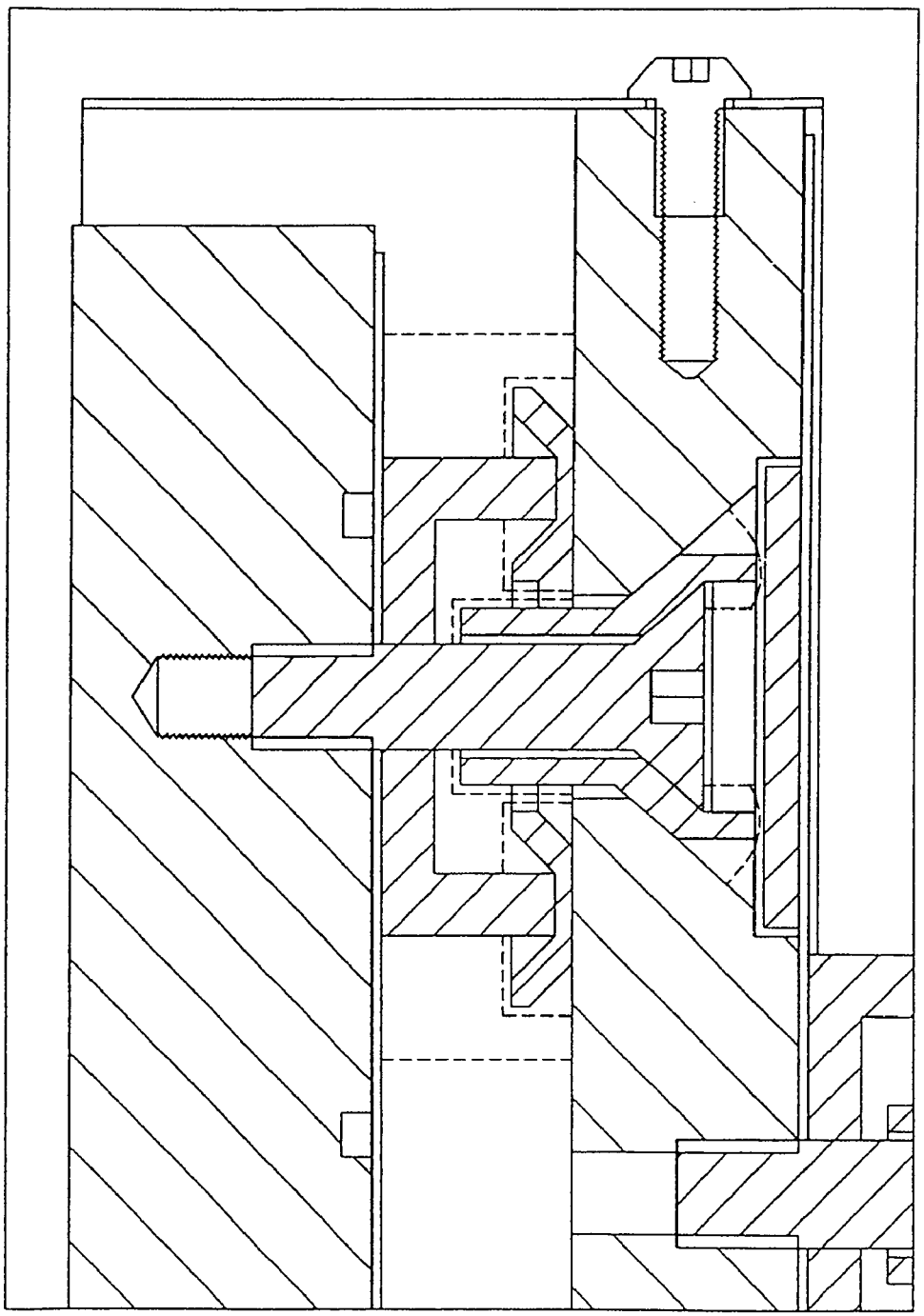
FIG. 13 is an enlarged cross sectional view of the interconnection between a pair of chuck assembly elements of the chuck of FIG. 11 illustrating a minimum air breakdown distance.

While making high voltage measurements the air between two conductors will break down, e.g., arc, if the conductors are sufficiently close together. For example, when testing at 5000 volts the spacing between conductors should be in excess of about 0.2 inches. Referring to FIG. 13 (same as FIG. 12), it may be observed that all of the paths through the air from the screw and conductive circular U-shaped member (signal potential) to another conductor at guard potential is greater than 0.2 inches, as indicated by the "----" lines. For example, the fins of the U-shaped insulating member 246 may increases the creepage distance greater than about 0.2 inches.

After further consideration another factor impacting rigidly is the interconnecting materials themselves. Preferably, the conductive member is at least three times as thick as the insulating material between the adjacent chuck assembly elements, and more preferably at least six times as thick. In this manner, a major portion of the spacing material is rigid conductive material which is significantly less prone to compression than the insulating material under pressure.

After extensive testing the present inventor came to the further realization that the dielectric absorption of the dielectric material tends to drain faster when both sides of the dielectric material are in face-to-face contact with electrical conductors. In contrast, when only one side of the dielectric material is in face-to-face contact with an electrical conductor then the dielectric absorption drains slowly with changes in electrical potential and hence degrades the electrical performance. Accordingly, referring to FIG. 12, it may be observed that substantially all (or at least a major portion) of the insulating material in contact with a conductor has an opposing conductor. For example, the upper portion of the center insulating portion is not in contact with the conductive screw because it would be difficult to provide an opposing conductor, and be further complicated if a requisite spacing is necessary.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

I claim:

1. A chuck for a probe station comprising:
   (a) a first chuck assembly element having a lower surface and an upper surface thereon suitable to support a wafer;
   (b) a second chuck assembly element having an upper surface and a lower surface where the upper surface is in opposing relationship to said lower surface of said first chuck assembly element;
   (c) a chuck spacing mechanism interconnecting said first and second chuck assembly elements and defining the spacing between said first and second chuck assembly elements;
   (d) said chuck spacing mechanism including a first insulator spaced apart from said first chuck assembly element and having a first surface in pressing engagement with said upper surface of said second chuck assembly element and a second surface in pressing engagement with a first surface of a conductive spacer, a second surface of said conductive spacer in pressing engagement with said lower surface of said first chuck assembly element.

2. The chuck of claim 1 wherein said chuck spacing mechanism includes a central member extending there through.

3. The chuck of claim 2 wherein said central member is rigidly attachable to said first chuck assembly element.

4. The chuck of claim 3 wherein said central member is electrically isolated from said second chuck assembly element.

5. The chuck of claim 4 wherein said central member secures said first and second chuck assembly elements together with said insulator and said conductive spacer defining said spacing.

6. The chuck of claim 1 wherein said first insulator is generally U-shaped.

7. The chuck of claim 1 wherein said conductive spacer is generally U-shaped.

8. The chuck of claim 6 wherein said conductive spacer is generally U-shaped.

* * * * *